United States Patent
Poletto et al.

(10) Patent No.: US 12,381,549 B2
(45) Date of Patent: Aug. 5, 2025

(54) PROTECTION FOR SWITCHED ELECTRONIC DEVICES

(71) Applicant: STMicroelectronics S.r.l., Agrate Brianza (IT)

(72) Inventors: Vanni Poletto, Milan (IT); Fabrizio Loi, Lodi (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 276 days.

(21) Appl. No.: 18/144,456

(22) Filed: May 8, 2023

(65) Prior Publication Data
US 2023/0370056 A1 Nov. 16, 2023

(30) Foreign Application Priority Data
May 13, 2022 (IT) .......................... 102022000009986

(51) Int. Cl.
| | |
|---|---|
| *H03K 17/08* | (2006.01) |
| *B60R 16/033* | (2006.01) |
| *H02M 1/32* | (2007.01) |
| *H03K 17/082* | (2006.01) |

(52) U.S. Cl.
CPC ....... *H03K 17/0822* (2013.01); *B60R 16/033* (2013.01); *H02M 1/32* (2013.01); *H03K 2217/0063* (2013.01); *H03K 2217/0072* (2013.01)

(58) Field of Classification Search
CPC ....... H03K 17/0822; H03K 2217/0063; H03K 2217/0072; H02M 1/32; B60R 16/033
See application file for complete search history.

(56) References Cited

U.S. PATENT DOCUMENTS

| | | | |
|---|---|---|---|
| 10,855,183 B1* | 12/2020 | Barrenscheen ... | H02M 3/33592 |
| 2003/0021073 A1* | 1/2003 | Nagata ............... | H03K 17/0822 |
| | | | 361/78 |
| 2004/0260501 A1 | 12/2004 | Fey et al. | |
| 2015/0303805 A1 | 10/2015 | Franchini et al. | |
| 2016/0341776 A1* | 11/2016 | Sekine ................... | H02M 1/32 |

(Continued)

FOREIGN PATENT DOCUMENTS

EP    3104525 A1    12/2016

OTHER PUBLICATIONS

IT Search Report and Written Opinion for priority application, IT Appl. No. 102022000009986, report dated Dec. 21, 2022, 10 pgs.

*Primary Examiner* — Rafael O De Leon Domenech
(74) *Attorney, Agent, or Firm* — Crowe & Dunlevy LLC

(57) ABSTRACT

An HS switching transistor is coupled between a high-side node and a switching node. An LS switching transistor is coupled between the switching node and a low-side node. An inductive load is coupled to the switching node in a way where one of the HS/LS switching transistors is freewheeling. In response to detection of a short circuit occurring at the switching node with the freewheeling switching transistor in the conductive state: an electrical signal at the switching node is sensed, a comparison is made between the sensed electrical signal and a threshold level, and a driving signal is provided to control freewheeling switching transistor to switch to the non-conductive state when the comparison indicates that the electrical signal has reached the threshold level.

18 Claims, 10 Drawing Sheets

(56) References Cited

U.S. PATENT DOCUMENTS

2018/0141506 A1    5/2018  Yamashita
2020/0381913 A1*  12/2020  Harada .................... H02P 8/36
2022/0190717 A1*  6/2022  Matsushita ............. H02M 1/32

* cited by examiner

PROTECTION FOR SWITCHED ELECTRONIC DEVICES

PRIORITY CLAIM

This application claims the priority benefit of Italian Application for Patent No. 102022000009986 filed on May 13, 2022, the content of which is hereby incorporated by reference in its entirety to the maximum extent allowable by law.

TECHNICAL FIELD

The description relates to switched electronic devices, such as flyback ones.

For instance, one or more embodiments may be applied in protecting such devices from current intensities exceeding safety operation margins.

One or more embodiments may be used in applications where, as is the case in the automotive field, for instance, preserving accuracy in operation over the lifetime of an electronic device is a desirable feature.

BACKGROUND

A pair of power switches in a so-called half-bridge arrangement may be configured to drive electromechanical loads in either one of two configurations: a High-Side Driver (HSD) configuration in which the load is connected between an output node of the half-bridge and a ground line, and a Low-Side Driver configuration (LSD) in which the load is connected between a voltage supply line and the output node of the half-bridge.

For instance, the HSD configuration may be used to control voltage slope at output pin VO while the HS power FET is quickly turned on/off in order to minimize a blanking time of the current monitor during the switching from LS power FET to HS power FET and vice versa.

During operation, sudden short-circuits (for example, across the load or across the power switch) may damage operation of the switches in the half-bridge arrangement. Therefore, protection against such short circuits is a relevant parameter.

During current regulation, management of potential shorts among pins is an aspect to manage to prevent device damage.

For instance: while the HS switch is turned on, there may be a short-circuit between the output node and the supply voltage line; and while the LS switch is turned on, there may be a short-circuit between the output node and the ground line.

In both these cases, current flows through the respectively turned-on power switch and the switch may experience a current intensity exceeding "normal" values, that is above maximum regulated current values.

Existing solutions can present one or more of the following drawbacks: current flows in the switch until the fault-detection is triggered; use of shunt resistors in the current path, leading to increased area footprint; and conflict between setting intensity threshold and limiting shunt spread.

There is a need in the art to contribute in overcoming the aforementioned drawbacks.

SUMMARY

One or more embodiments may relate to a circuit.

One or more embodiments may relate to a corresponding method.

One or more embodiments may relate to a switched electronic device.

One or more embodiments facilitate protection of the LS switch against short-circuits of the output node to ground during recirculation of the current in the LS power switch of a half-bridge arrangement.

One or more embodiments facilitate protection of the HS switch against short-circuits of the output node to the supply voltage line during recirculation of the current in the HS power switch of a half-bridge arrangement.

One or more embodiments provide an improved diagnostic turn-off of the driver in response to a current intensity above a safety threshold.

One or more embodiments facilitate extending product lifetime and increasing the safety margin of operation, countering the risk of damaging the device.

One or more embodiments provide an improved overcurrent diagnostic and protection at the small cost of few simple components.

One or more embodiments provide a relatively simple and cheap solution to protect device from undesired damage.

One or more embodiments have a reduced (virtually zero) impact in terms of silicon area with respect to conventional solutions.

One or more embodiments facilitate relaxing constraints for automotive applications.

One or more embodiments reduce the risk of device damage in the field.

One or more embodiments counter cross conduction current from power supply to ground.

BRIEF DESCRIPTION OF THE DRAWINGS

One or more embodiments will now be described, by way of non-limiting example only, with reference to the annexed Figures, wherein.

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

Throughout the figures annexed herein, like parts or elements are indicated with like references/numerals unless the context indicates otherwise, and for brevity a corresponding description will not be repeated for each and every figure.

The references used herein are provided merely for convenience and hence do not define the extent of protection or the scope of the embodiments.

Figure 1:
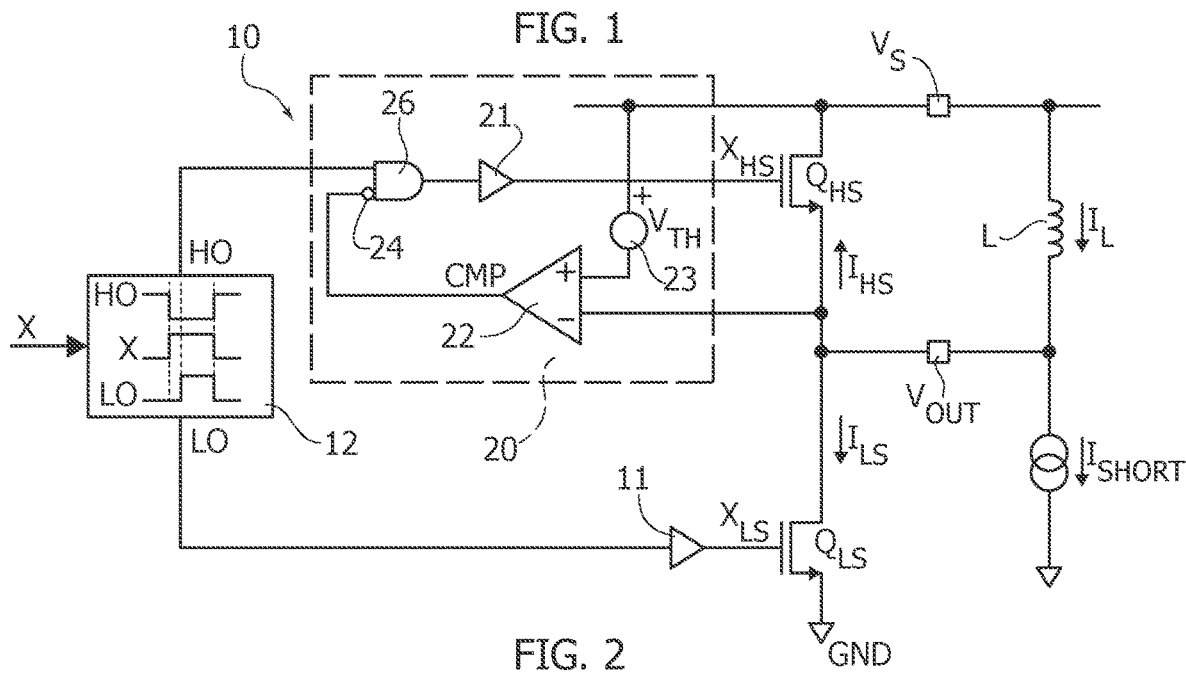
FIG. 1 is a diagram exemplary of a circuit as per the present disclosure.
Figure 3:
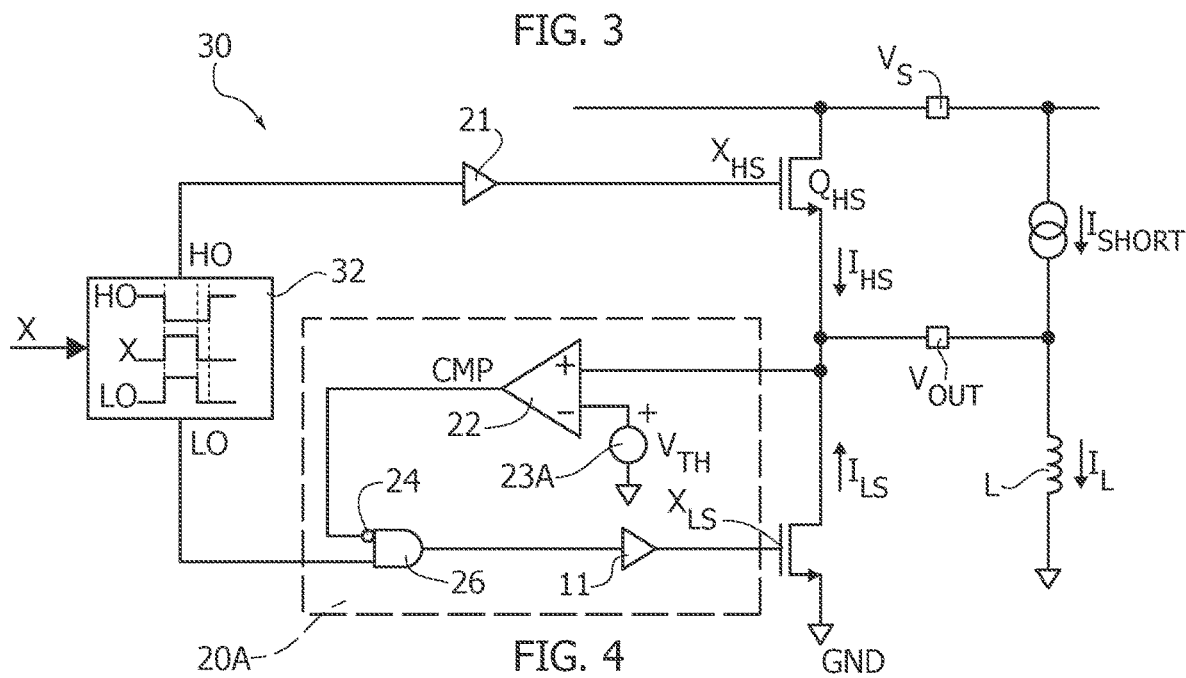
FIG. 3 is a diagram exemplary of a circuit as per the present disclosure.

As exemplified in FIGS. 1 and 3, a switching (or switched) voltage regulator circuit 10 configured to provide a regulated voltage level to a load L includes a power supply node $V_S$ configured to receive a DC supply voltage referred to ground GND, such as a DC voltage level $V_S$=12 V provided by a battery (not visible in FIG. 1). The circuit 10 further includes a first (for example, high-side) switching transistor $Q_{HS}$ (for example, a n-channel or p-channel metal-oxide-semiconductor—MOS—field-effect transistor—FET) and a second (for example, low-side) switching transistor $Q_{LS}$ (for example, a MOSFET like the high-side one). The first and second switching transistors $Q_{HS}$, $Q_{LS}$ are coupled to each other (for example, drain node $V_{OUT}$ of the second switching transistor $Q_{LS}$ connected to anode of "freewheeling" transistor $Q_{HS}$) and have respective drain-source current paths therethrough arranged in series between the supply node $V_S$ and ground GND, via a switching node $V_{OUT}$ intermediate the first $Q_{HS}$ and second $Q_{LS}$ switching transistors.

As exemplified in FIGS. 1 and 3, the switching node $V_{OUT}$ is configured to be coupled to an inductive load L (such as a coil inductor with inductance L, for instance) referred to a reference voltage (for example, ground GND or supply voltage $V_S$) to provide an output voltage $V_{OUT}$ thereto.

FIG. 1 shows a first configuration 10 of the switching circuit where the inductive load L (for example, an inductor) is arranged with one end coupled (for example, directly) to the switching node $V_{OUT}$ and another end coupled (for example, directly) to the supply node $V_S$; in other words, in the first configuration 10 the load L is parallel to the first switching transistor $Q_{HS}$.

FIG. 3 shows a second configuration 30 of the switching circuit where the inductive load L is arranged with one end coupled (for example, directly) to the switching node $V_{OUT}$ and another end coupled (for example, directly) to ground GND; in other words, in the second configuration 30 the load L is parallel to the second switching transistor $Q_{LS}$.

As exemplified herein, a switching transistor coupled (for example, in parallel) to an energy storage element (such as the inductor L of FIGS. 1 and 3) is currently referred to as "freewheeling". For instance, the first configuration 10 features the second transistor $Q_{HS}$ as the freewheeling one, while the second configuration features the first transistor $Q_{LS}$ as the freewheeling one.

As exemplified in FIG. 1, the driver circuit 10 optionally further comprises (for example, low-side and high-side) amplifiers 11, 21 coupled to the control nodes of the first $Q_{HS}$ and second $Q_{LS}$ transistors. The amplifiers 11, 21 are configured to amplify respective control (or drive) signals $X_{HS}$, $X_{LS}$ provided to the control terminals of the first $Q_{HS}$ and second $Q_{LS}$ switching transistors.

As exemplified in FIG. 1, the control signals $X_{LS}$, $X_{HS}$ are based on a control signal X received at a timing circuit block 12 (for example, a dead time controller, known per se) configured to operate the circuit 10. In an embodiment, control signal X may, for instance, comprise a pulse-width modulated (PWM) signal.

For instance, the timing circuit 12 receives the control signal X and, based on the received control signal X, produces a high-side signal HO for the second switching transistor $Q_{HS}$ and a low-side control signal LO for the low-side switching transistor $Q_{LS}$.

As exemplified in FIG. 1, the timing circuit block 12 performs (in a manner per se known) adjustment of a dead time (for example, a time interval during which both switching transistors QLS, QHS are turned off) while making sure that the current flow paths therethrough are not driven to be conductive at the same time, so as not to make them both conductive at a same time. This is in order to counter the risk of a simultaneous current conduction from low-side switching transistor $Q_{LS}$ to high-side switching transistor $Q_{HS}$.

As exemplified herein, a method comprises: coupling a high-side switching transistor $Q_{HS}$ between a high-side reference node $V_S$ and a switching node $V_{OUT}$; and coupling a low-side switching transistor $Q_{LS}$ between the switching node $V_{OUT}$ and a low-side reference node GND. In this method: the high-side switching transistor comprises a high-side control terminal $X_{HS}$ configured to receive a high-side control signal HO as well as a current flow path therethrough between the high-side reference node $V_S$ and the switching node, the high-side switching transistor $Q_{HS}$ is configured to be switched towards a conductive state in response to the high-side control signal having a first value, and the current flow path through the high-side switching transistor $Q_{HS}$ provides a high-side current flow line $I_{HS}$ between the high-side reference node and the switching node. Also in this method, the low-side switching transistor $Q_{LS}$ comprises a low-side control terminal $X_{LS}$ configured to receive a low-side control signal LO as well as a current flow path therethrough between the switching node $V_{OUT}$ and the low-side reference node GND, the low-side switching transistor is configured to be switched towards a conductive state in response to the low-side control signal having a first value, and the current flow path through the low-side switching transistor provides a current flow line $I_{LS}$, $I_{HS}$ between the switching node and the low-side reference node. The method further comprises coupling an inductive load L, $Z_L$ to the switching node and to a reference node selected out of the high-side reference node and the low-side reference node, with a respective one of the high-side switching transistor and/or the low-side switching transistor being freewheeling as a result. In response to a short circuit occurring at the switching node with the respective freewheeling switching transistor in the conductive state, the method further comprises: sensing an electrical signal at the switching node; performing a comparison 22 between the electrical signal sensed at the switching node and a threshold level; and providing a driving signal to the control node of the respective freewheeling switching transistor to switch the respective freewheeling switching transistor to the non-conductive state as a result of the comparison indicating that the electrical signal has reached the threshold level.

For instance, the method comprises: coupling a sensing transistor $M_S$ to the switching node and to said reference node; and sensing the electrical signal at the switching node via the sensing transistor; wherein the sensing transistor has an area proportional to the area of the freewheeling switching transistor.

As exemplified herein, providing the driving signal to the control node of the freewheeling switching transistor comprises: in response to the electrical signal reaching the threshold level, triggering T_I a time counter 67 to start counting time intervals; asserting a comparison signal CMP for as long as the electrical signal reaches the threshold level; and in response to the time counter reaching a time count equal to a time interval $T_{DEL}$ and to the comparison signal remaining asserted during the time interval, providing the driving signal to the control node of the freewheeling switching transistor, switching the freewheeling switching transistor towards the non-conductive state as a result.

As exemplified herein, the method comprises, in response to the time counter 67 failing to reach a time count equal to the time interval $T_{DEL}$, resetting the time counter.

As exemplified in FIG. 1, the amplifiers 11, 21 are configured to be coupled to the timing circuit 12 to receive respective signals LO, HO for respective transistors $Q_{HS}$ and $Q_{LS}$.

For instance, one of the amplifiers 21, 11 is included in a protection circuit block 20, 20A to protect the freewheeling transistor $Q_{HS}$, $Q_{LS}$ of the configuration 10, 30 from overcurrent due to a short circuit (represented as a current generator SC producing current $I_{SHORT}$) at the output node $V_{OUT}$.

As exemplified in FIG. 1, in case of a short-circuit current $I_{SHORT}$ flowing between the output node $V_{OUT}$ and ground GND (for example, due to a short circuit at the output node $V_{OUT}$) and in the absence of protection circuitry 20, the short circuit current $I_{SHORT}$ would flow through the first switching transistor $Q_{HS}$ until the (for example, de-asserted) control signal HO provided at the control terminal drives it to power-off. Such an uncontrolled current flow $I_{SHORT}$ through the freewheeling transistor $Q_{HS}$ may lead to damage thereof or may impose oversized design constraints, for example, to make sure the first switching transistor $Q_{HS}$ can withstand current intensities different from the normal operative ones.

As exemplified in FIG. 1, the protection circuit block 20 includes a comparator 22 comprising a first (for example, non-inverting +) input node coupled to a reference voltage $V_{TH}$ (for example, produced by an adder circuit 23 coupled to the supply node $V_S$ and to the first input node + of the comparator 22) and a second input node (for example, inverting node −) coupled to the output node $V_{OUT}$ of the circuit 10. The comparator 22 is configured to perform a comparison of the output voltage $V_{OUT}$ and the voltage threshold $V_S$-$V_{TH}$. The comparator 22 further comprises an output node to provide a comparison signal CMP asserted to a first logic value (for example, low or "0") in response to the output voltage $V_{OUT}$ reaching the voltage threshold $V_S$-$V_{TH}$ or de-asserted to a second logic value (for example, high or "1") in response to the output voltage $V_{OUT}$ failing to reach the voltage threshold $V_S$-$V_{TH}$. The block 20 further includes a logic inverter 24 coupled to the output node of the comparator 22, the logic inverter 24 configured to produce a negated version of the comparison signal CMP. A logic AND gate 26 has a first input node coupled to the timing circuit block 12 to receive the first control signal HO for the first switching transistor $Q_{HS}$, and a second input node coupled to the logic inverter 24 to receive the negated version of the comparison signal CMP therefrom. The logic AND gate 26 is configured to assert its output signal when both signals received at the input nodes (that is, the negated version of the comparison signal CMP and the control signal HO for the high side) are asserted, in a manner per se known. The first amplifier 21 is arranged to have an input node coupled to the timing circuit block 12 via the logical AND gate 26, the amplifier 21 further having its output coupled to the control terminal of the freewheeling transistor $Q_{HS}$.

It is noted that FIG. 1 is illustrative of a field-effect (MOSFET) implementation of the circuit 10. A bipolar junction transistor (BJT) implementation is likewise possible, in which the control terminals will be the bases of these transistors and the current paths therethrough will be represented by the emitter-collector current flow path. For instance, amplifiers 11, 21 may be configured accordingly to drive BJTs.

Figure 2:
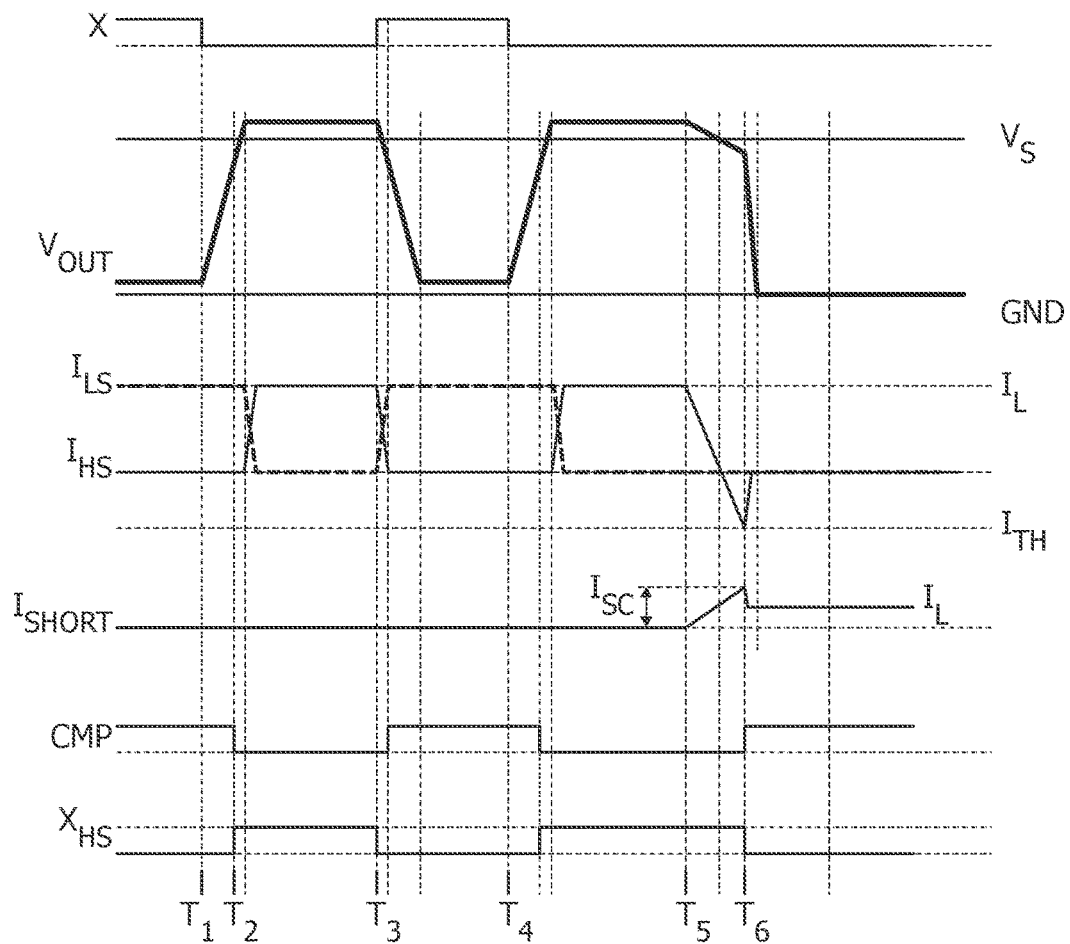
FIG. 2 is a diagram exemplary of signals over time in the circuit exemplified in FIG. 1.

FIG. 2 is a diagram of the evolution over time of logic signals that may be used in the circuit configuration 10 exemplified in FIG. 1.

As known to a person skilled in the art, logic signals can be described in terms of their binary logic values, that is one of a finite number of states.

For instance: in a first scenario currently referred to as "active high logic", an active logic value is denoted as "TRUE", "1" or high, while an inactive logic value is denoted as "FALSE", "0" or low; and in a second scenario currently referred to as "active low logic", an active logic value is denoted as "FALSE", "0" or low while the second logic value may be denoted as "TRUE", "1" or high.

As discussed herein, a signal indicated to be "asserted" (to a logic value) refers to a signal that is active, irrespective of whether it is active high or low; similarly, a signal indicated to be "de-asserted" (to a logic value) refers to a signal that is inactive, irrespective of whether it is not active high or low.

As exemplified in FIG. 2, during a time interval $T_1$-$T_4$ in which the short circuit current is absent (represented as a null short circuit current $I_{SHORT}$), operating the circuit in the first configuration 10 comprises: at a first time instant $T_1$, receiving the control signal X having a first (for example, falling) edge, so that it goes from being asserted at a first logic value (for example, high or "1") to being de-asserted at a second logic value (for example, low or "0"); and in response to the received control signal X being de-asserted at $T_1$, (simultaneously) de-asserting the control signal LO for the low-side and asserting the control signal HO for the high-side via the timing circuit block 12; in this way, the timing circuit block 12 may be simplified.

As exemplified in FIG. 2, the timing circuit block 12 protects power switches $Q_{HS}$, $Q_{LS}$ from cross-conduction at time $T_3$ while during the time interval $T_1$-$T_2$ the comparator 22 asserts the comparison signal COMP, thereby countering that the control signal HO propagates and turns on the power switch $Q_{HS}$.

In response to the control signal LO for the low-side being de-asserted at $T_1$, the second control signal $X_{LS}$ (which is an amplified version of the control signal LO) is also de-asserted and triggers a power-off of the second switching transistor $Q_{LS}$ until the current flow path therethrough is made non-conductive.

During power-off of the second switching transistor $Q_{LS}$, the output voltage $V_{OUT}$ (initially, at time $T_1$, at ground level) starts increasing towards the supply voltage level $V_S$ as a result of the load current $I_L$ entering the switching node $V_{OUT}$.

During a time interval $T_1$-$T_2$ between the first $T_1$ and a second $T_2$ time instant in which the load current $I_L$ flows in the switching node $V_{OUT}$, the comparator 22 detects that the voltage at the switching node $V_{OUT}$ is lower than the threshold voltage $V_S$-$V_{TH}$ at its differential input nodes + and −, asserting the output signal CMP to the first logic value (for example, high or "1"); therefore, the logic AND gate 26 does not have both input signals asserted to the same logic value and de-asserts the output which (after amplification in the first amplifier 21) leads to the first control signal $X_{HS}$ remaining de-asserted and maintaining the first switching transistor $Q_{HS}$ powered off (that is, with the current flow path therethrough made non-conductive). Therefore, the comparison signal CMP "masks" the control signal HO, forcing the high-side transistor QHS to remain turned off (that is, with the current flow path therethrough made non-conductive).

At the second time instant $T_2$, the output voltage $V_{OUT}$ at the switching node $V_{OUT}$ reaches the supply voltage level $V_S$. As the threshold value $V_S$-$V_{TH}$ is almost equal to the supply voltage level $V_S$, in response to the output voltage $V_{OUT}$ approaching the supply voltage level $V_S$ the comparator 22 de-asserts the comparison signal CMP to the second logic value (for example, low or "0").

In response to the comparison signal CMP being de-asserted at second instant $T_2$, the logic AND gate 26 asserts the first control signal $X_{HS}$ to the second logic value (for example, high or "1") as a result of having both input signals asserted (negated CMP and HO). As a result, the first control signal $X_{HS}$ triggers a power-on of the first switching transistor $Q_{HS}$ until the current flow path therethrough is made conductive.

In response to the power-on of the first switching transistor $Q_{HS}$, a first current $I_{HS}$ increasingly flows in the conductive path through the first switching transistor $Q_{HS}$ while a second current $I_{LS}$ through the second switching transistor $Q_{LS}$ decays until reaching zero.

For instance, still during the considered time interval $T_1$-$T_2$, operating the circuit 10 comprises: checking (for example, almost continuously) whether the output voltage received $V_{OUT}$ reaches or fails to reach the voltage threshold $V_S$-$V_{TH}$, via the comparator 22 that senses the output voltage $V_{OUT}$ at its inverting input node. In response to this checking: alternatively, asserting the comparison signal CMP in response to the output voltage level $V_{OUT}$ reaching the supply voltage level $V_S$; or de-asserting the comparison signal CMP in response to the output voltage $V_{OUT}$ failing to reach the supply level $V_S$.

As exemplified in FIG. 2, the output voltage $V_{OUT}$ stays at the supply voltage $V_S$ until, at a third time instant $T_3$, the timing circuit block 12 receives the control signal X with a (for example, rising) edge, that is going from being de-asserted to being asserted.

In response to the received control signal X being asserted at the instant $T_3$, simultaneously de-asserting the control signal HO for the high-side while, after lapse of a dead time δ set by the timing circuit block 12, asserting the control signal LO for the low-side. In this way, the second switching transistor $Q_{LS}$ is powered back on solely after complete power-off of the high-side transistor $Q_{HS}$.

For instance, the operation of the circuit 10 in the time interval $T_3$+δ and a fourth time instant $T_4$ exemplified in FIG. 2 is reciprocally symmetric to that discussed in the foregoing with respect to the time interval $T_1$-$T_2$.

With respect to time interval $T_1$-$T_2$, during the time interval $T_3$-$T_4$ the operations comprise powering off the first switching transistor $Q_{HS}$ while the second switching transistor $Q_{LS}$ is powered on and draws current from the output node $V_{OUT}$ until the output voltage level $V_{OUT}$ reaches ground voltage level GND.

As exemplified in FIG. 2, in a further time interval $T_5$-$T_6$ between the fifth time instant $T_5$ and a sixth time instant $T_6$, a non-null short circuit current $I_{SHORT}$ is produced in response to a (for example, accidental) short-circuit SC is applied between the switching node VO and ground GND while the freewheeling transistor (for example, the first switching transistor $Q_{HS}$) is powered on, that is with the current flow path therethrough made conductive.

As exemplified in FIG. 2, operating the protection circuit 20 comprises: detecting the first current $I_{HS}$ flowing in the freewheeling transistor (for example, $Q_{HS}$) towards the output node $V_{OUT}$ (for example, by sensing the voltage at the output node $V_{OUT}$ via the comparator 22, the voltage being a function of the first current $I_{HS}$); and performing a comparison (for example, again, via the comparator 22) of the detected first current $I_{HS}$ with a threshold current $I_{TH}$ (for example, $I_{TH}$=$V_{TH}$/$R_{ON}$ where $R_{ON}$ is the on-resistance of the first switching transistor $Q_{HS}$). In response thereto, alternatively: asserting the comparison signal CMP in response to the first current $I_{HS}$ reaching or failing to exceed the threshold current $I_{TH}$; or de-asserting the comparison signal CMP in response to the first current $I_{HS}$ failing to reach or exceeding the threshold current $I_{TH}$.

As exemplified in FIG. 2, as at a sixth time instant $T_6$, the comparator 22 asserts the comparison signal in response to the first current $I_{HS}$ reaching the threshold current value $I_{TH}$ (corresponding to the condition that the short circuit current $I_{SHORT}$ exceeds a limit current $I_{SC}$=$I_{TH}$+$I_L$, where $I_L$ is the current flowing in the load Z).

For instance, in response to the comparison signal CMP being asserted at the sixth instant $T_6$, the AND logic gate 26 has input signals (negated CMP and control signal HO for the high-side) which are not both asserted and therefore de-asserts the first control signal $X_{HS}$ to the second logic value (for example, low or "0"). For instance, as soon as the first control signal $X_{HS}$ is de-asserted at time instant $T_6$ and is received at the control terminal of the first switching transistor $Q_{HS}$, this is powered-off (that is, the current flow path therethrough is made non-conductive), thus protecting the freewheeling transistor $Q_{HS}$ against the excessive current −$I_{HS}$>−$I_{TH}$ flowing in the direction out from the output node $V_{OUT}$.

As exemplified in FIG. 3, in an alternative scenario the circuit is used in the second configuration 30, where the second switching transistor $Q_{LS}$ is arranged as the freewheeling one in place of the first switching transistor $Q_{HS}$, that is with the inductive load L coupled between the switching node $V_{OUT}$ and ground GND.

As exemplified in FIG. 3, an adapted timing circuit 32 performs (in a manner per se known) adjustment of a dead time (for example, a time interval during which both switching transistors $Q_{LS}$, $Q_{HS}$ are turned off) while making sure that the current flow paths there through are not driven to be conductive at the same time, so as not to make them both conductive at a same time, as discussed in the following.

In the alternative scenario exemplified in FIG. 3, a protection circuit 20A (alternative to the protection circuit 20) is coupled to the second switching transistor $Q_{LS}$ for protection thereof from a short circuit (again, represented as the current generator SC producing a short circuit current $I_{SHORT}$) which may occur (for example, accidentally) while the current flow path therethrough is made conductive.

As exemplified in FIG. 3, the alternative protection circuit 20A for the second switching transistor $Q_{LS}$ is similar to the protection circuit 20 exemplified in FIG. 1 save for a different coupling of the protection circuit elements.

As exemplified in FIG. 3, for instance, the comparator 22 comprises the first (for example, non-inverting +) input node coupled to the switching node $V_{OUT}$ and the second (for example, inverting −) input node coupled to the threshold voltage level $V_{TH}$ (for example, provided via a voltage generator 23A referred to ground GND), the comparator 22 further comprising the output node CMP coupled to the logic inverter gate 24 to provide thereto the comparison signal. The logic AND gate 26 has a first input node coupled to the timing circuit block 32 to receive a control signal LO for the second switching transistor $Q_{LS}$, the logic AND gate 26 having the second input node coupled to the logic inverter 24 to receive the negated version of the comparison signal CMP therefrom.

Figure 4:
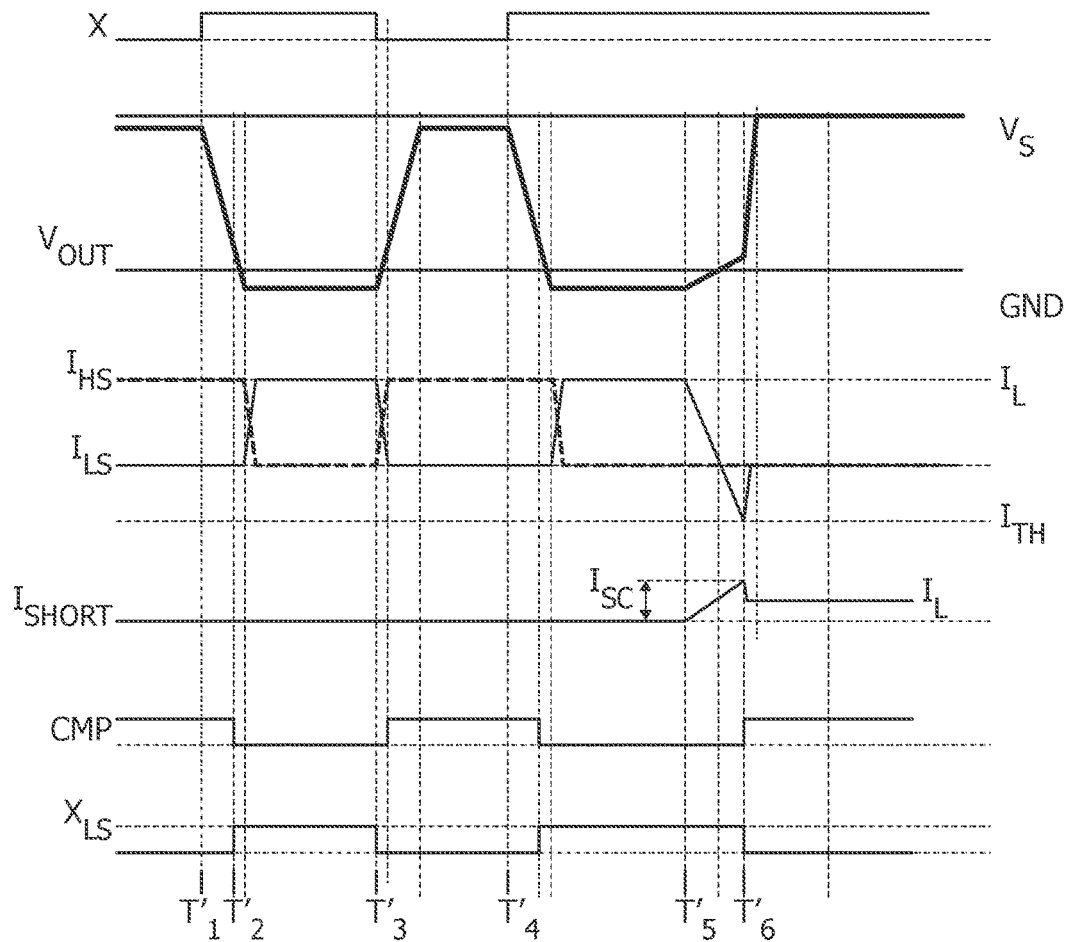
FIG. 4 is a diagram exemplary of signals over time in the circuit exemplified in FIG. 3.

FIG. 4 is a diagram of the evolution over time of signals that may be used in the alternative circuit configuration 30 of FIG. 3.

As exemplified in FIG. 4, in the absence of any short circuit (represented as a null short circuit current $I_{SHORT}$) during a time interval $T_1'$-$T_4'$, operating the circuit in the second circuit configuration 30 comprises: at a first time instant $T_1'$, receiving (for example, via the timing circuit block 32) the control signal X having a first (for example, rising) edge and going from being de-asserted to being asserted.

In response to the first edge of the control signal X at $T_2'$, simultaneously asserting the control signal LO for the low-side and de-asserting the control signal HO for the high-side; therefore, the dead time control circuit 32 may be simplified as discussed in the foregoing.

In response to the control signal HO for the high-side being de-asserted at first instant $T_1$, the first control signal $X_{HS}$ (which is an amplified version of the control signal HO) is also de-asserted and triggers a power-off of the first switching transistor $Q_{HS}$ until the current flow path therethrough is made non-conductive.

During power-off of the first switching transistor $Q_{HS}$, the output voltage $V_{OUT}$ (initially, at first instant $T_1'$, set at a voltage equal to the voltage supply $V_S$) starts decreasing towards ground GND, via the load current $I_L$ flowing out of the switching node $V_{OUT}$ during the turn-off time of the high-side switching transistor $Q_{HS}$.

During a time interval $T_1'$-$T_2'$ between the first $T_1'$ and a second $T_2'$ time instant in which the load current $I_L$ flows in the switching node $V_{OUT}$, the comparator 22 detects that the voltage at the switching node $V_{OUT}$ is lower than the threshold voltage $V_S$-$V_{TH}$, asserting the output signal CMP to the first logic value (for example, low or "0"); therefore, the logic AND gate 26 does not have both input signals asserted to the same logic value and de-asserts the output which (after amplification in the first amplifier 21) leads to the second control signal $X_{LS}$ remaining de-asserted and maintaining the second switching transistor $Q_{LS}$ powered off (that is, with the current flow path therethrough made non-conductive).

At a second time instant $T_2'$, the output voltage $V_{OUT}$ at the switching node $V_{OUT}$ reaches the ground level GND; as the threshold value $V_{TH}$ is (ideally) equal to the ground level GND, in response to the output voltage $V_{OUT}$ reaching the ground level GND the comparator de-asserts the comparison signal CMP to the second logic value (for example, low or "0").

In response to the comparison signal CMP being de-asserted at second instant $T_2'$, the logic AND gate 26 asserts the second control signal $X_{LS}$ to the first logic value (for example, high or "1") as a result of having both input signals asserted (negated CMP and LO); as a result, the second control signal $X_{LS}$ triggers a power-on of the second switching transistor $Q_{LS}$ until the current flow path therethrough is made conductive.

In response to the power-on of the second switching transistor $Q_{LS}$, a second current $I_{LS}$ increasingly flows in the conductive path through the second switching transistor $Q_{LS}$ while a first current $I_{HS}$ through the first switching transistor $Q_{HS}$ decays until reaching zero.

For instance, still during the considered time interval $T_1'$-$T_2'$, operating the circuit in the second configuration 30 exemplified in FIG. 3 comprises checking (for example, almost continuously) whether the output voltage received $V_{OUT}$ reaches or fails to reach the voltage threshold $V_{TH}$ (for example, set almost equal to zero), via the comparator 22 that senses the output voltage $V_{OUT}$ at its inverting input node. In response thereto, alternatively: asserting the comparison signal CMP in response to the output voltage level $V_{OUT}$ reaching the ground voltage level GND; or de-asserting the comparison signal CMP in response to the output voltage $V_{OUT}$ failing to reach the ground level GND.

As exemplified in FIG. 4, the output voltage $V_{OUT}$ stays at a voltage level equal to ground GND until, at a third time interval $T_3'$, the timing circuit block 32 receives the control signal X with a second (for example, falling) edge, that is going from being asserted to being de-asserted.

In response to the received control signal X being de-asserted, simultaneously asserting the control signal LO for the low-side while, after lapse of a dead time δ set by the adapted timing circuit block 32, asserting the control signal HO for the high-side; in this way, the first switching transistor $Q_{HS}$ is powered back on solely after complete power-off of the second switching transistor $Q_{LS}$.

For instance, the operation of the circuit 30 in the time interval $T_3'$+δ and a fourth time instant $T_4'$ exemplified in FIG. 4 is reciprocally symmetric to that discussed in the foregoing with respect to the time interval $T_1'$-$T_2'$. With respect to time interval $T_1'$-$T_2'$, during the time interval $T_3'$-$T_4'$ the operation comprises powering off the second switching transistor $Q_{LS}$ while the first switching transistor $Q_{HS}$ is powered on and draws current from the output node $V_{OUT}$, until the output voltage level $V_{OUT}$ reaches the voltage supply level $V_S$.

As exemplified in FIG. 4, in a further time interval $T_4'$-$T_5'$ between the fourth time instant $T_4'$ and a fifth time instant $T_5'$, a non-null short circuit current $I_{SHORT}$ is produced in response to a (for example, accidental) short-circuit between the switching node VOUT and ground GND while the first switching transistor $Q_{HS}$ is turned on, that is with the current flow path therethrough made conductive.

As exemplified in FIG. 4, operating the alternative protection circuit 20A comprises: detecting the second current $I_{LS}$ flowing in the freewheeling transistor (for example, $Q_{LS}$) towards the output node $V_{OUT}$ (for example, by sensing the voltage at the output node $V_{OUT}$ via the comparator 22, the voltage being a function of the second current $I_{LS}$); and performing a comparison (for example, again, via the comparator 22) of the detected second current $I_{LS}$ with a threshold current $I_{TH}$ (for example, $I_{TH}=V_{TH}/R_{ON}$ where $R_{ON}$ is the on-resistance of the first switching transistor $Q_{LS}$). In response thereto, alternatively: asserting the comparison signal CMP in response to the second current $I_{LS}$ reaching or failing to exceed the threshold current $I_{TH}$; or de-asserting the comparison signal CMP in response to the second current $I_{LS}$ failing to reach or exceeding the threshold current $I_{TH}$.

As exemplified in FIG. 4, as at a sixth time instant $T_6'$, the comparator 22 asserts the comparison signal CMP in response to the second current $I_{LS}$ reaching the threshold current value $I_{TH}$ (corresponding to the condition that the short circuit current $I_{SHORT}$ exceeds a limit current $I_{SC}=I_{TH}+I_L$, where $I_L$ is the current flowing in the load Z).

For instance, in response to the comparison signal CMP being asserted at the sixth instant $T_6'$, the AND logic gate 26 has input signals (negated CMP and control signal LO for the low-side) which are not both asserted and therefore de-asserts the first control signal $X_{LS}$ to the second logic value (for example, low or "0"). For instance, as soon as the first control signal $X_{LS}$ is de-asserted at time instant $T_6'$ and is received at the control terminal of the second switching transistor $Q_{LS}$, this is powered-off (that is, the current flow path therethrough is made non-conductive), thus protecting the freewheeling transistor $Q_{LS}$ against the excessive current $-I_{LS}>-I_{TH}$ flowing in the direction into the output node $V_{OUT}$.

Figure 5:
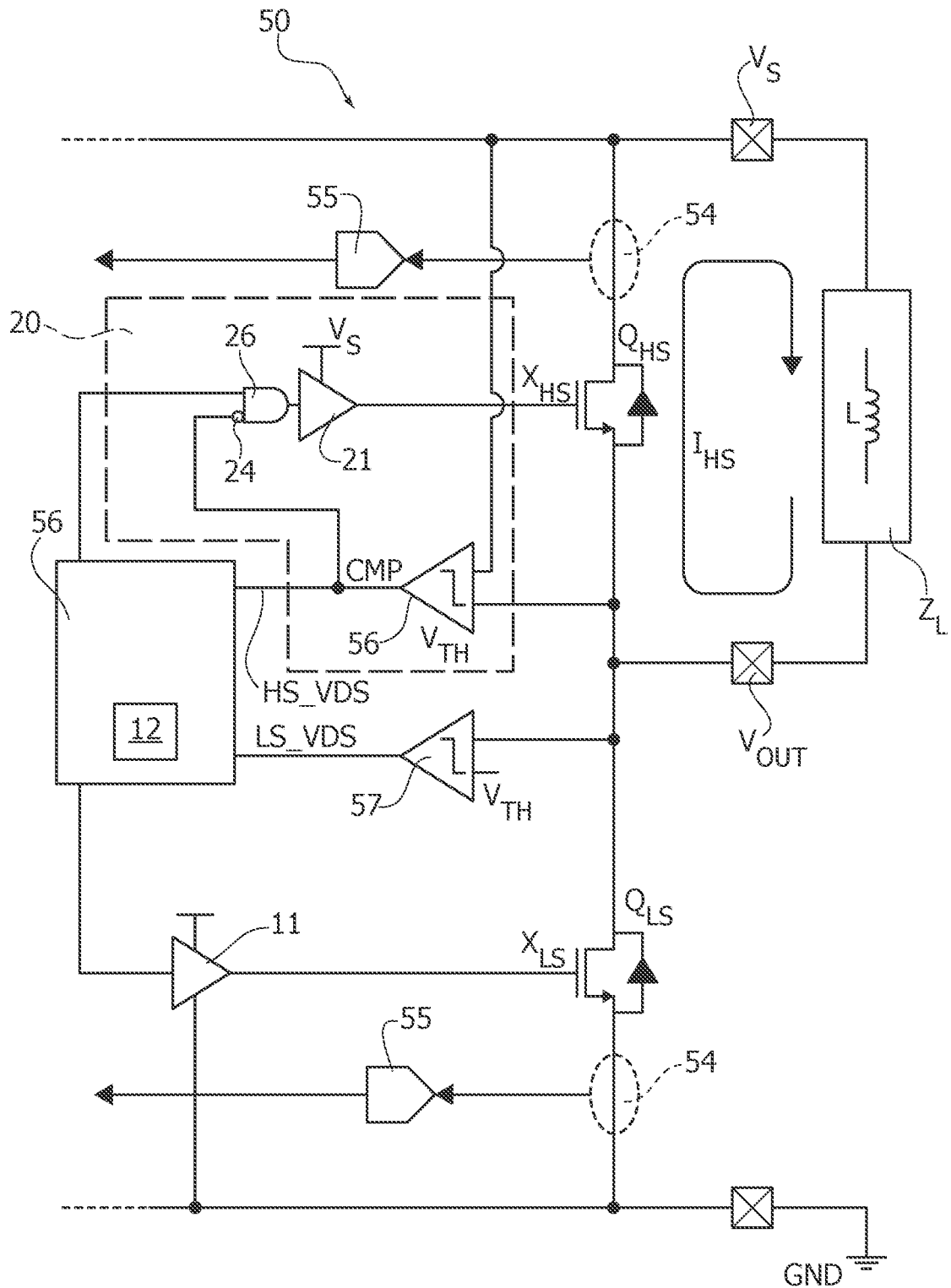
FIG. 5 is a diagram of a device as per the present disclosure.

As exemplified in FIG. 5, one of the circuits 10, 30 may be employed in a device 50, for instance the protection circuit 20 for the arrangement 10.

As exemplified in FIG. 5, the protection circuit 20 preferably comprises a window comparator 52 to detect the threshold voltage $V_{TH}$, so as to dispense from the adder circuit 21 in the protection circuit 20, 20A.

As exemplified in FIG. 5, the window comparator 52 can be configured to select the threshold voltage level $V_{TH}$ to have a value independent from the value of the output regulated current $I_{HS}$. For instance, while the threshold $V_{TH}$ can be notionally set to zero, due to the random offset in a non-ideal comparator 52, it can be set at few tenths of milliVolts (mV) below the drain-source voltage of the second transistor $Q_{HS}$.

As exemplified in FIG. 5, the second switching transistor $Q_{LS}$ (not freewheeling) is also coupled to a different protection circuit 57, such as a conventional protection circuit per se known, for instance.

As exemplified in FIG. 5, the device 50 further comprises: sensing circuitry 54 associated to each of the first $Q_{LS}$ and second $Q_{HS}$ switching transistors, the sensing circuitry 54 configured to provide respective sensing current signals indicative of the current flowing in each of the switching transistors $Q_{LS}$, $Q_{HS}$; and analog-to-digital (A/D) converter circuitry 55 configured to digitize the sensing current signals flowing in the sensing circuitry 54.

For instance, the A/D converter circuitry 14 provides digital signals D indicative of the currents flowing in the switching transistors $Q_{LS}$, $Q_{HS}$, which is indicative of the intensity of the current in the inductive load Z. For instance, this digital signal D may be fed to control circuitry 52 (comprising the timing circuit 12, for instance) to create a feedback loop to adjust the control signal X accordingly, for instance, in ways per se known.

It is noted that an act of digitizing the sensing currents is purely exemplary and in no way limiting. For instance, hybrid digital/analog or purely analog circuitry suitable to process sensed current signals may be coupled to the sensing circuitry 54.

As exemplified in FIG. 5, as an alternative arrangement the buffer amplifiers 21, 11 configured to provide the control signals $X_{HS}$, $X_{LS}$ to respective control terminals of respective switching transistors $Q_{LS}$, $Q_{HS}$ may be interposed between the control circuitry 52 and the input node of the logical AND gate 26, while maintaining substantially unaltered the functions of the protection circuit 20.

As exemplified in FIG. 5, the first switching transistor $Q_{HS}$ works as an "active diode", that is in a condition in which the second current $I_{HS}$ flows solely in one direction, from output pin $V_{OUT}$ to supply node $V_S$.

As exemplified in FIG. 5, the comparator signal COMP can be provided to the control circuit 52 (labeled as HS_VDS in FIG. 5) and it may be exploited as a "masking" or deactivating signal for the turn-on phase of the second switching transistor $Q_{HS}$. For instance, if the output voltage $V_{OUT}$ fails to reach the threshold $V_{TH}$ (for example, about −50 mV respect to $V_S$), the turn on of the high-side transistor $Q_{HS}$ may be turned off.

As exemplified in FIGS. 6 to 11, an alternative protection circuit architecture 60, 80 can be used flexibly in cases where any one of the first $Q_{HS}$ and second $Q_{LS}$ switching transistors may be employed as the freewheeling one.

Figure 6:
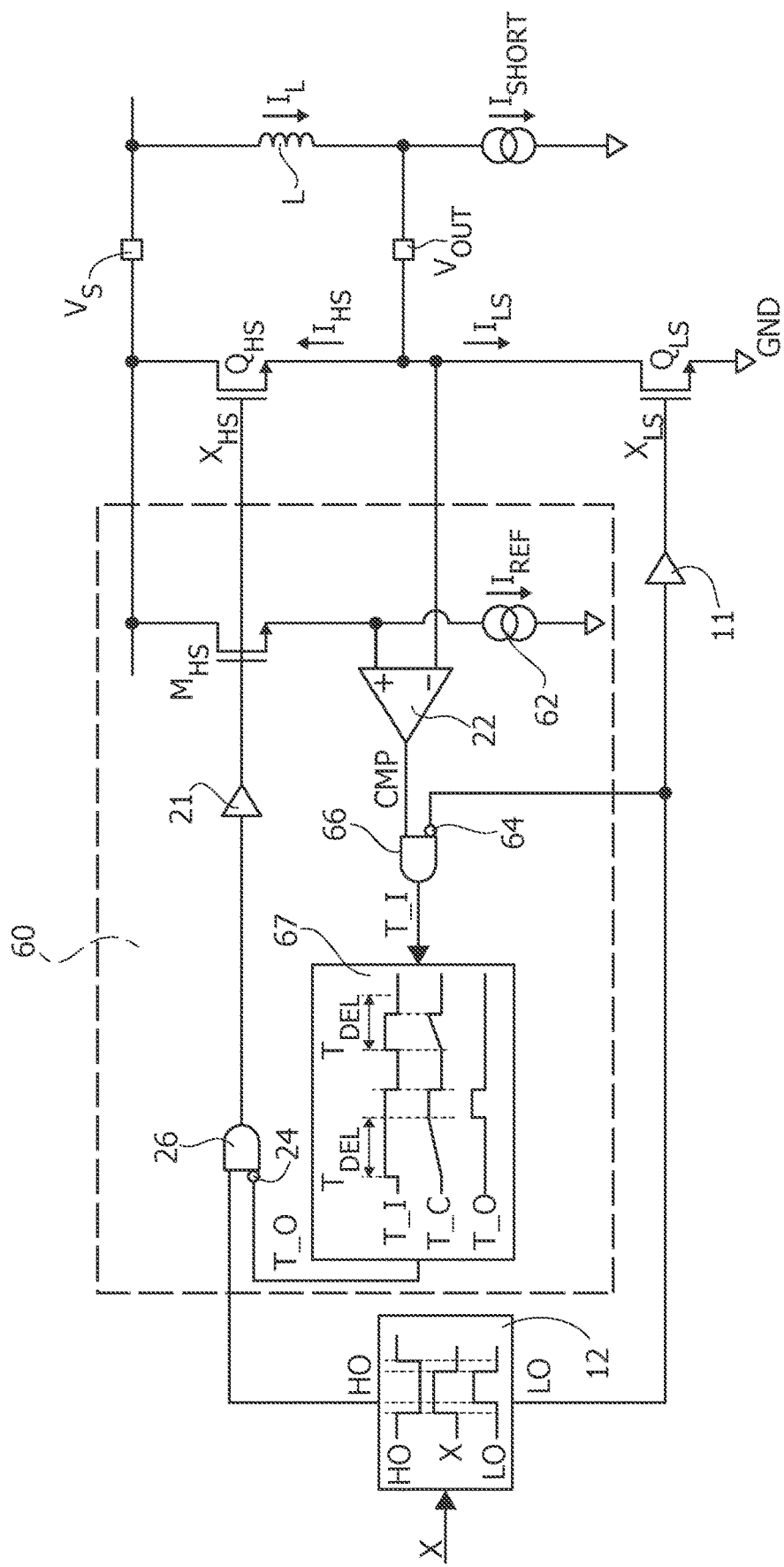
FIG. 6 is a diagram exemplary of a circuit as per the present disclosure.

As exemplified in FIG. 6, the alternative protection circuit 60 for the protection of the freewheeling transistor $Q_{HS}$ further comprises a sense transistor $M_S$ associated to the (freewheeling) first switching transistor $Q_{HS}$ and having a common control terminal therewith (for example, corresponding to the output node of the first amplifier 21). The sense transistor $M_S$ having a current flow path therethrough between a first (for example, drain) sense terminal $V_S$ and a second (for example, source) sense terminal coupled to the first (for example, non-inverting +) input node of the comparator 22, the second terminal of the sense transistor $M_S$ also coupled to ground GND via a reference current generator 62 configured to generate a reference current $I_{REF}$. A further logical AND gate 66 has a first input node coupled to the output node CMP of the comparator 22 and a second input node coupled (via a further logical inverter 64) to the control terminal of the second switching transistor $Q_{LS}$ (for example, via the second amplifier 11). A time counter 67 is coupled to the output node of the further logical AND gate 66 to receive therefrom a trigger signal T_I. The time counter 67 is configured to provide a time count signal T_O, as discussed in the following, the time count signal T_O being provided as an input to the inverter logic circuit 24 (which then provides a negated version thereof to the input node of the logic AND gate 26). A "bilateral" timing circuit block 12 is configured to provide the control signal HO for the high-side and the control signal LO for the low-side by introducing the dead time interval in both signals with respect to the control signal X, as discussed in the following.

In one or more cases as exemplified in FIG. 6, the sense transistor $M_S$ is a down-scaled replica of the first freewheeling transistor (for example, $Q_{HS}$). For instance, the sense transistor $M_S$ comprises a respective junction area which is a fraction of (for example, 1/N times) of the junction area of the freewheeling transistor (for example, $Q_{HS}$) associated therewith.

As exemplified in FIG. 6, in response to the trigger signal T_I having a first (for example, rising) edge, the time counter 67 starts counting time units (see internal count signal T_C increasing after the rising edge of the trigger signal T_I) until reaching a time count "ceiling" equal to a pre-set time delay $T_{DEL}$.

For instance: if the trigger signal T_I is asserted at the first logic value (for example, high or "1") for a time length longer than the pre-set time limit $T_{DEL}$ measured by signal T_C, the time counter 67 outputs the time count signal T_O asserted to the first logic value (for example, high or "1"). Else, if the trigger signal T_I is asserted at the first logic value (for example, high or "1") for a time length shorter than the pre-set time limit $T_{DEL}$ measured by signal T_C, the time counter 67 outputs the time count signal T_O de-asserted to the second logic value (for example low or "0").

For instance, the pre-set time $T_{DEL}$ is greater than the duration of the turn-off time of the switching transistors $Q_{HS}$, $Q_{LS}$.

Figure 7:
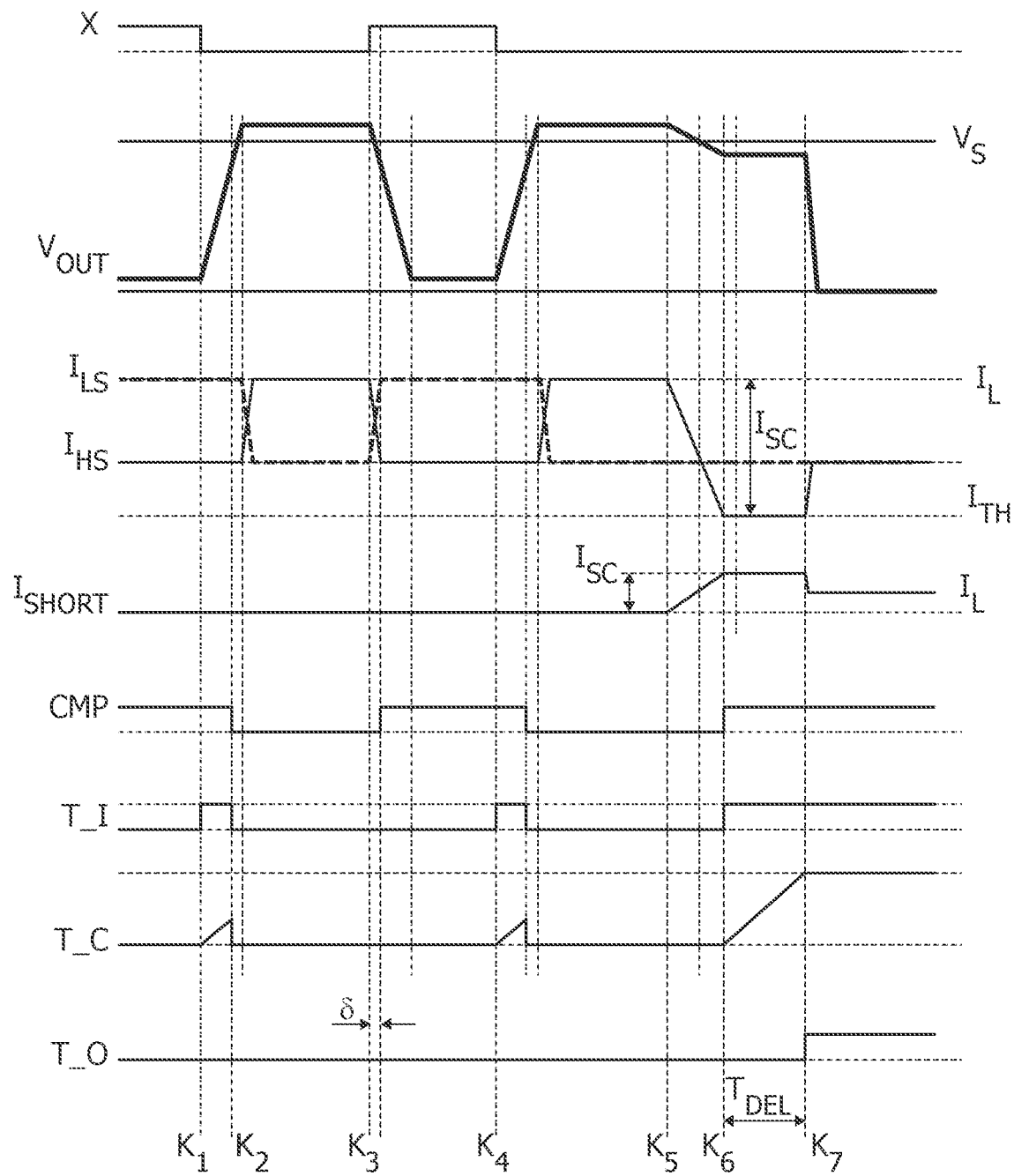
FIG. 7 is a diagram exemplary of signals over time in the circuit exemplified in FIG. 6.

FIG. 7 is exemplary of time diagrams of signals that may be present in the circuit exemplified in FIG. 6.

As exemplified in FIG. 7, operating the circuit exemplified in FIG. 6 in the absence of a short circuit (represented by the short circuit current $I_{SHORT}$ provided by the current generator SC being zero) includes, at a first time instant $K_1$, receiving the control signal X with the second (for example, falling) edge, that is going from being asserted to being de-asserted.

In response to the control signal X having the second edge at first instant $K_1$, via the bilateral timing circuit block 12, simultaneously de-asserting the control signal LO for the low-side while asserting the control signal HO for the high-side after lapse of the dead time δ.

In response to the control signal LO for the low-side being de-asserted, the second control signal $X_{LS}$ is also de-asserted, triggering power-off for the second switching transistor $Q_{LS}$ as a result.

In a time interval $K_1$-$K_2$ during the time in which the power-off the second switching transistor $Q_{LS}$ takes place, the output voltage $V_{OUT}$ (initially, at first instant $K_1$, at ground level GND) increases towards supply voltage $V_S$. Still in the considered time interval $K_1$-$K_2$, the comparator 22 detects an "anomalous" condition at its differential input nodes +,−, asserting the comparison signal CMP.

At the second time instant $K_2$, the further logical AND gate 66 receives the negated version of the LO control signal and the comparison signal CMP and asserts the trigger signal T_I as a result, triggering the time counter 67 to start counting time units.

As exemplified in FIG. 7, for instance at the second time instant $K_2$, the output voltage $V_{OUT}$ reaches the supply voltage $V_S$, for example, taking a time shorter than the pre-set time $T_{DEL}$ in doing so. In response to the output voltage $V_{OUT}$ reaching the supply voltage $V_S$, the comparator 22 checks that the output voltage $V_{OUT}$ has reached the threshold voltage $V_{TH}$ (for example, equal to the supply voltage $V_S$) and de-asserts the comparison signal CMP to the second logic value (for example, low or "o"). As a result of the control signal LO for the low-side and the comparison signal CMP being both de-asserted to the second value, the trigger signal T_I is reset to being de-asserted, resetting the time counter 67 before it reaches end of count. As a result of asserting HO with a delay (for example, "dead time") δ with respect to de-asserting X, the logic AND gate 26 asserts the first control signal $X_{HS}$ to the first logic value as a result of the control signal HO for the high-side and the negated version of the time count signal T_O being both asserted (for example, high or "1").

In response to the first control signal $X_{HS}$ being asserted to the first logic value (for example, high or "1"), the second current $I_{LS}$ flowing in the second switching transistor $Q_{LS}$ decreases and reaches zero while the first current $I_{HS}$ flowing in the first switching transistor $Q_{HS}$ increases.

As exemplified in FIG. 7, for instance at a third time instant $K_3$ the control signal X has a first (for example, rising) edge and goes from the second logic value (for example, low or "0") to the first logic value (for example, high or "1"). In response to the control signal X having the first edge, the control signal HO for the high-side is simultaneously de-asserted to the second logic value and, after lapse of the dead time δ, the control signal LO for the low-side is asserted to the first logic value.

As exemplified in FIG. 7, the output voltage $V_{OUT}$ stays at a voltage level equal to that of the supply voltage $V_S$ until the third time interval $K_3$.

For instance, the operation of the circuit exemplified in FIG. 6 in the time interval between the third time instant $K_3$ and a fourth time instant $K_4$ exemplified in FIG. 7 is reciprocally symmetric to that discussed in the foregoing with respect to the time interval $K_1$-$K_2$, with the second switching transistor $Q_{LS}$ turned on while the first switching transistor $Q_{HS}$ is turned off and draws current from the switching node $V_{OUT}$, until the output voltage level $V_{OUT}$ reaches and remains at ground voltage level GND.

As exemplified in FIG. 7, between a fifth time instant $K_5$ and a sixth time instant $K_6$, a short circuit occurs (represented as an increasing short circuit current $I_{SHORT}$) while the first switching transistor $Q_{HS}$ is turned on, that is with the current flow path through the freewheeling transistor being conductive.

As exemplified in FIG. 7, the protection circuit 60 detects the first current $I_{HS}$ flowing in the first switching transistor $Q_{HS}$ towards the switching node $V_{OUT}$ (for example, by sensing the voltage level at the switching node $V_{OUT}$ via the comparator 22) and checks (for example, again, via the comparator 22) whether the first current $I_{HS}$ exceeds or fails to exceed a threshold current $I_{TH}$. For example, $I_{TH}=N*I_{REF}$ where N is based on the ratio 1/N between areas of the sense transistor $M_S$ and the second switching transistor $Q_{HS}$.

As exemplified in FIG. 7, as at a sixth time instant $K_6$, the comparator 22 asserts the comparison signal CMP to the second value (for example, "1" or high) in response to the first current $I_{HS}$ reaching the threshold value $I_{TH}$ (corresponding to the condition that the short circuit current $I_{SHORT}$ exceeds a limit current $I_{SC}=I_{TH}+I_L$, where $I_L$ is the current flowing in the load Z).

As exemplified in FIG. 7, in response to the comparison signal CMP having the first logic value at the sixth time instant $K_6$, the trigger signal T_I is asserted to the first logic value, triggering start of the time counter 67 as a result.

For instance, as long the comparison signal CMP remains asserted to the first logic value for a time longer than the pre-set time $T_{DEL}$, the time counter 67 reaches end of count and asserts the time count signal T_O to the first logic value (for example, high or "1").

As exemplified in FIG. 7, at a seventh time instant $K_7$, that is after lapse of the pre-set time $T_{DEL}$ from the sixth time instant $K_6$, the first control signal $X_{HS}$ is de-asserted to the second logic value (for example, low or "0") in response to the time counter 67 reaching end of count.

For instance, the AND logic 26 asserts the first control signal $X_{HS}$ to the second logic value (for example, low or "0") as a combination of the control signal HO provided by the timing circuit 12 and the negated version 24 of the time count signal T_O provided by the time counter 67.

For instance, as soon as the second control signal $X_{HS}$ having the second logic value is received at the control terminal of the first switching transistor $Q_{HS}$, the current flow path therethrough is made non-conductive, thus protecting the second switching transistor $Q_{HS}$ against the excessive current $-I_{HS} > -I_{TH}$ flowing in the direction out from the switching node $V_{OUT}$.

Figure 8:
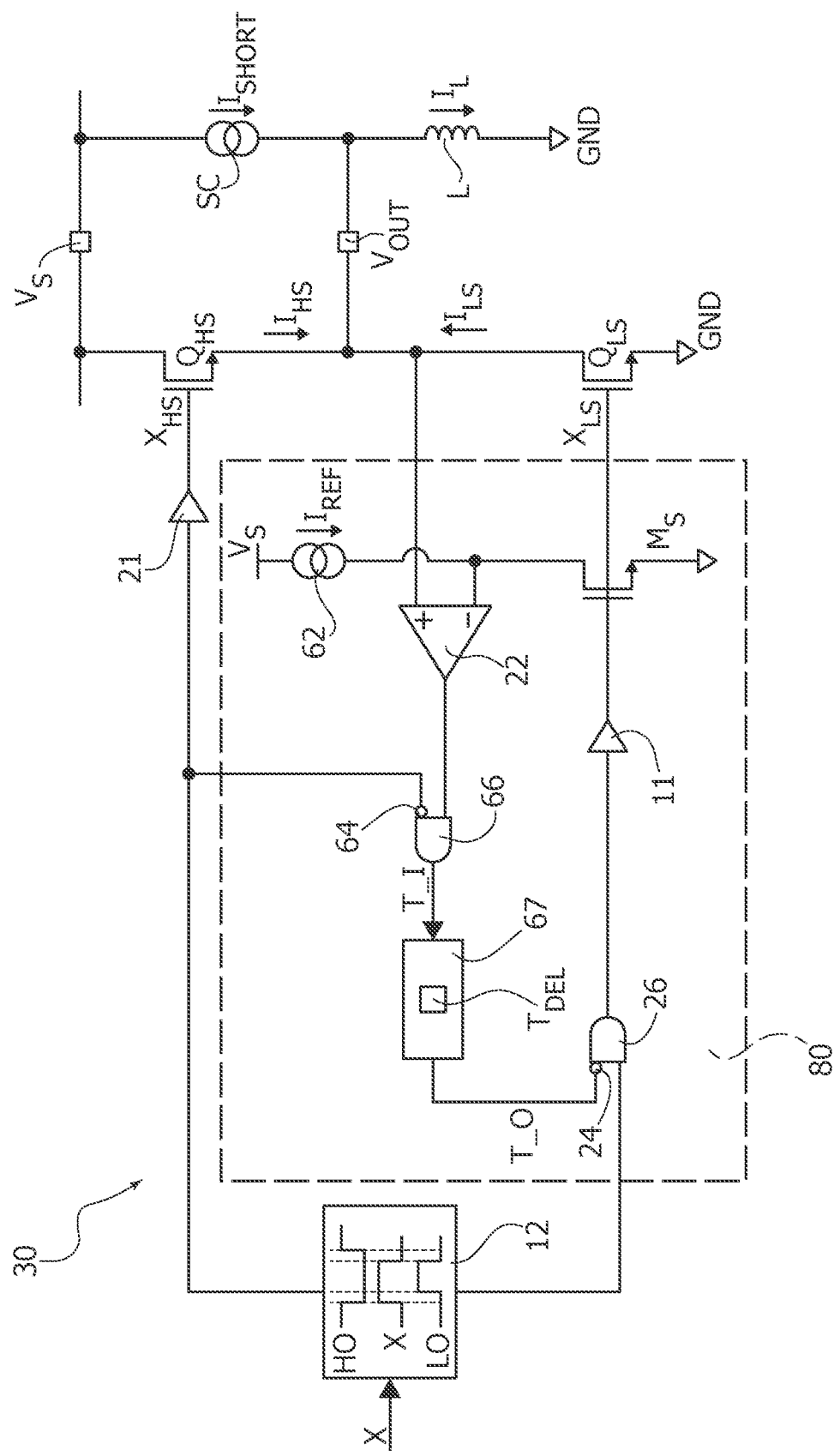
FIG. 8 is a diagram exemplary of a circuit as per the present disclosure.

As exemplified in FIG. 8, the protection circuit exemplified in FIG. 6 may be used: in the first configuration 60 to protect the first switching transistor $Q_{HS}$, as exemplified in FIG. 6; and in the second configuration 80 to protect the second switching transistor $Q_{LS}$, as exemplified in FIG. 8.

As exemplified in FIG. 8, the second configuration 80 for the protection of the freewheeling transistor $Q_{LS}$ differs from the first configuration 60 in that the sense transistor $M_S$ is associated to the second switching transistor $Q_{LS}$ and has a common control terminal therewith (for example, corresponding to the output node of the second amplifier 11), the sense transistor $M_S$ having a current flow path therethrough between a first (for example, drain) sense terminal coupled to the second (for example, inverting −) input node of the comparator 22 and a second (for example, source) sense terminal coupled to ground GND, the first sense terminal further coupled to the supply node $V_S$ via a reference current generator 62 producing a reference current $I_{REF}$.

Figure 9:
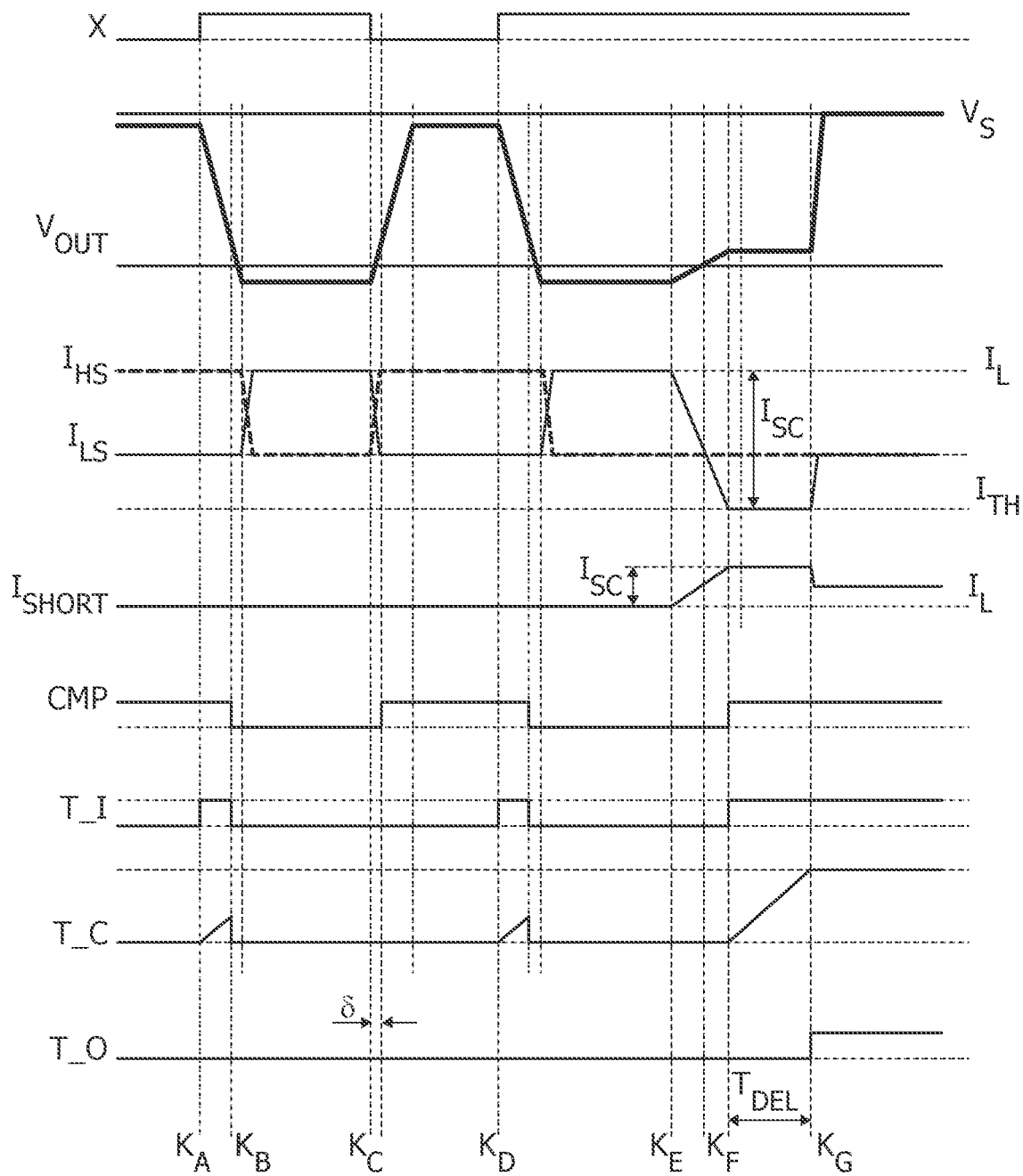
FIG. 9 is a diagram exemplary of signals over time in the circuit exemplified in FIG. 8.

FIG. 9 is exemplary of time diagrams of signals that may be present in the circuit exemplified in FIG. 8.

As exemplified in FIG. 9, operating the circuit exemplified in FIG. 8 in the absence of a short circuit (represented by the short circuit current $I_{SHORT}$ provided by the current generator SC being zero) includes, at a first time instant $K_A$, receiving the control signal X with a second (for example, rising) edge, the control signal X going from the second logic value (for example, low or "0") to the first logic value (for example, high or "1").

In response to the control signal X having the first logic value (for example, high or "1"), the timing circuit block 12 asserts the control signal LO for the low-side to the first value (for example, "1" or high) after lapse of the dead time δ and the control signal HO for the high-side to the second logic value (low or "0"), immediately.

In response to the control signal HO for the high-side having the second logic value, the first control signal $X_{HS}$ is de-asserted, powering off the first switching transistor $Q_{HS}$ as a result.

During the power-off time of the first switching transistor $Q_{HS}$, the output voltage $V_{OUT}$ (initially at supply voltage level $V_S$) decreases towards ground GND.

During the power-off time of the first switching transistor $Q_{HS}$, the comparator 22 detects an "anomalous" condition at its differential input nodes +,−, producing the comparison signal CMP with the first logic value (for example, high or "1"); as a result of the negated version of the HO control signal and the comparison signal CMP being provided to the further logical AND gate 66, the trigger signal T_I is asserted to the first logic value (for example, high or "1"), triggering the time counter 67 to start counting time units.

As exemplified in FIG. 9, for instance at a second time instant $K_B$, the output voltage $V_{OUT}$ reaches ground level in a time interval $K_A$-$K_B$ shorter than the pre-set time $T_{DEL}$ of the time counter 67.

In response to the output voltage VOUT reaching ground GND, the comparator 22 checks that the output voltage VOUT has reached the threshold voltage (for example, equal to the ground level $V_{TH}$), producing the comparison signal CMP with the second logic value (for example, low or "0") as a result.

As a result of the comparison signal CMP having the second logic value, the trigger signal T_I is reset to zero before it reaches its end of count, so that the time count signal T_O is de-asserted as a result.

As a result of asserting LO with a delay (for example, "dead time") δ with respect to asserting X, the logic AND gate 26 asserts the first control signal $X_{LS}$ with the first logic value (for example, high or "1") as a combination of the control signal LO for the low-side and the negated version of the time count signal T_O both having the same logic value (for example, high or "1").

In response to the first control signal X having the first logic value (for example, high or "1"), the second current $I_{LS}$ flowing in the second switching transistor $Q_{LS}$ increases while the second current $I_{HS}$ flowing in the second switching transistor $Q_{HS}$ decays and reaches zero.

As exemplified in FIG. 9, for instance at a third time instant $K_C$, the control signal X has a second (for example, falling) edge and goes from the first logic value (for example, high or "1") to the second logic value (for example, low or "0").

In response to the control signal X having the second edge, the control signal LO for the low-side is immediately de-asserted and, after lapse of the dead time δ, the control signal HO for the high-side is asserted.

As exemplified in FIG. 9, the output voltage $V_{OUT}$ stays at a voltage level equal to that of the supply voltage $V_S$ until the third time interval $K_C$. For instance, the operation of the circuit exemplified in FIG. 8 in the time interval between the third time instant $K_C$ and a fourth time instant $K_D$ exemplified in FIG. 9 is reciprocally symmetric to that discussed in the foregoing with respect to the time interval $K_A$-$K_B$, with the second switching transistor $Q_{LS}$ powered off while the first switching transistor $Q_{HS}$ is powered on and draws current towards the switching node $V_{OUT}$, until the output voltage level $V_{OUT}$ reaches and remains at supply voltage level $V_S$.

As exemplified in FIG. 9, between a fifth time instant $K_E$ and a sixth time instant $K_F$, a short circuit occurs (represented as an increasing short circuit current $I_{SHORT}$) while the freewheeling transistor $Q_{LS}$ is powered on, that is with the current flow path therethrough made conductive.

As exemplified in FIG. 9, the protection circuit 80 detects the second current $I_{LS}$ flowing in the second switching transistor $Q_{LS}$ towards the switching node $V_{OUT}$ (for example, by sensing the voltage level at the switching node $V_{OUT}$ via the comparator 22) and checks (for example, again, via the comparator 22) whether the second current $I_{LS}$ exceeds or fails to exceed a threshold current $I_{TH}$, for example, $I_{TH}=N*I_{REF}$ where N is based on the ratio 1/N between areas of the sense transistor $M_S$ and the freewheeling transistor (for example, $Q_{LS}$).

As exemplified in FIG. 9, as at a sixth time instant $K_F$, the comparator 22 asserts the comparison signal CMP in response to the second current $I_{LS}$ reaching the threshold value $I_{TH}$ (corresponding to the condition that the short circuit current $I_{SHORT}$ exceeds a limit current $I_{SC}=I_{TH}+I_L$, where $I_L$ is the current flowing in the load Z).

As exemplified in FIG. 9, in response to the comparison signal CMP having the first logic value at the sixth time instant $K_F$, asserting the trigger signal T_I enable start of the time counter 67 as a result. For instance, as the comparison signal CMP remains asserted for a time length longer than the pre-set time $T_{DEL}$, the time counter 67 reaches end of count and outputs the time count signal T_O with the first logic value (for example, high or "1").

As exemplified in FIG. 9, at a seventh time instant $K_G$, that is after lapse of the pre-set time $T_{DEL}$ from the sixth time instant $K_F$, the first control signal $X_{HS}$ is de-asserted in response to the time counter 67 reaching end of count.

For instance, the AND logic gate 26 provides the second control signal $X_{LS}$ de-asserted (for example, low or "0") as a combination of the control signal HO provided by the timing circuit 12 and the negated version 24 of the time count signal T_O provided by the time counter 67.

For instance, as soon as the de-asserted second control signal $X_{LS}$ is received at the control terminal of the second switching transistor $Q_{LS}$, the current flow path therethrough is made non-conductive, thus protecting the second switching transistor $Q_{LS}$ against the excessive current $-I_{HS} > -I_{TH}$ flowing in the direction out from the switching node $V_{OUT}$.

As exemplified herein, a circuit comprises: a high-side switching transistor $Q_{HS}$ coupled between a high-side reference node $V_S$ and a switching node $V_{OUT}$; and a low-side switching transistor $Q_{LS}$ coupled between the switching node and a low-side reference node GND. The high-side switching transistor comprises a high-side control terminal $X_{HS}$ configured to receive a high-side control signal HO as well as a current flow path therethrough between the switching node and the high-side reference node $V_S$, the high-side switching transistor $Q_{HS}$ being configured to be switched towards a conductive state in response to the respective control signal having a first value, wherein the current flow path through the high-side switching transistor provides a high-side current flow line $I_{HS}$ between the switching node and the high-side reference node $V_S$. The low-side switching transistor $Q_{LS}$ comprises a low-side control terminal $X_{LS}$ configured to receive a low-side control signal LO as well as a current flow path therethrough between the switching node and the low-side reference node, the low-side switching transistor being configured to be switched towards a conductive state in response to the respective control signal having a first value, wherein the current flow path through the low-side switching transistor provides a current flow line $I_{LS}$, $I_{HS}$ between the switching node $V_{OUT}$ and the low-side reference node. An inductive load L, $Z_L$ is coupled to the switching node and to a reference node selected out of the high-side reference node and the low-side reference node, with the respective high-side switching transistor and/or low-side switching transistor arranged to be freewheeling. Protection circuitry 20, 20A, 60, 80 is coupled to the control node of the freewheeling switching transistor and to the switching node, wherein the protection circuitry is configured, in response to a short circuit occurring at the switching node while the freewheeling switching transistor is in the conductive state, to: sense an electrical signal at the switching node; perform a comparison between the electrical signal sensed at the switching node and a threshold level; and provide a driving signal to the control node of the respective freewheeling switching transistor to switch the respective freewheeling switching transistor to the non-conductive state as a result of the comparison indicating that the electrical signal has reached the threshold level.

As exemplified herein, the protection circuitry comprises a sensing transistor $M_S$ coupled to the switching node and to said reference node, the sensing transistor configured to sense the electrical signal at the switching node, wherein the sensing transistor has a transistor area proportional to the area of the freewheeling switching transistor.

As exemplified herein, the protection circuitry comprises: a comparator 22 having a first input node coupled to the switching node to receive the sensed electrical signal and a second node coupled to the reference voltage level, the comparator configured to perform the comparison (22) between the electrical signal sensed at the switching node and the threshold level, the comparator configured to assert a comparison signal as long as the electrical signal reaches the threshold level; logical circuitry 64, 66) coupled to the comparator (22) and configured to, in response to the electrical signal ($I_{HS}$; $I_{LS}$) reaching the threshold level ($V_{TH}$), assert a trigger signal (T_I); and a time counter (67) coupled to the logical circuitry (64, 66) to receive the trigger signal (T_I) therefrom, the time counter configured to start counting in response to the trigger signal (T_I) being asserted. The protection circuitry is configured to provide the driving signal to the control node of the switching transistor arranged to be freewheeling in response to the time counter reaching a time count equal to a time interval and to the comparison signal remaining asserted during the time interval, switching the freewheeling switching transistor towards the non-conductive state as a result.

As exemplified herein, the protection circuitry is configured to, in response to the time counter failing to reach a time count equal to a time interval while the comparison signal is asserted, reset the time counter.

Figure 10:
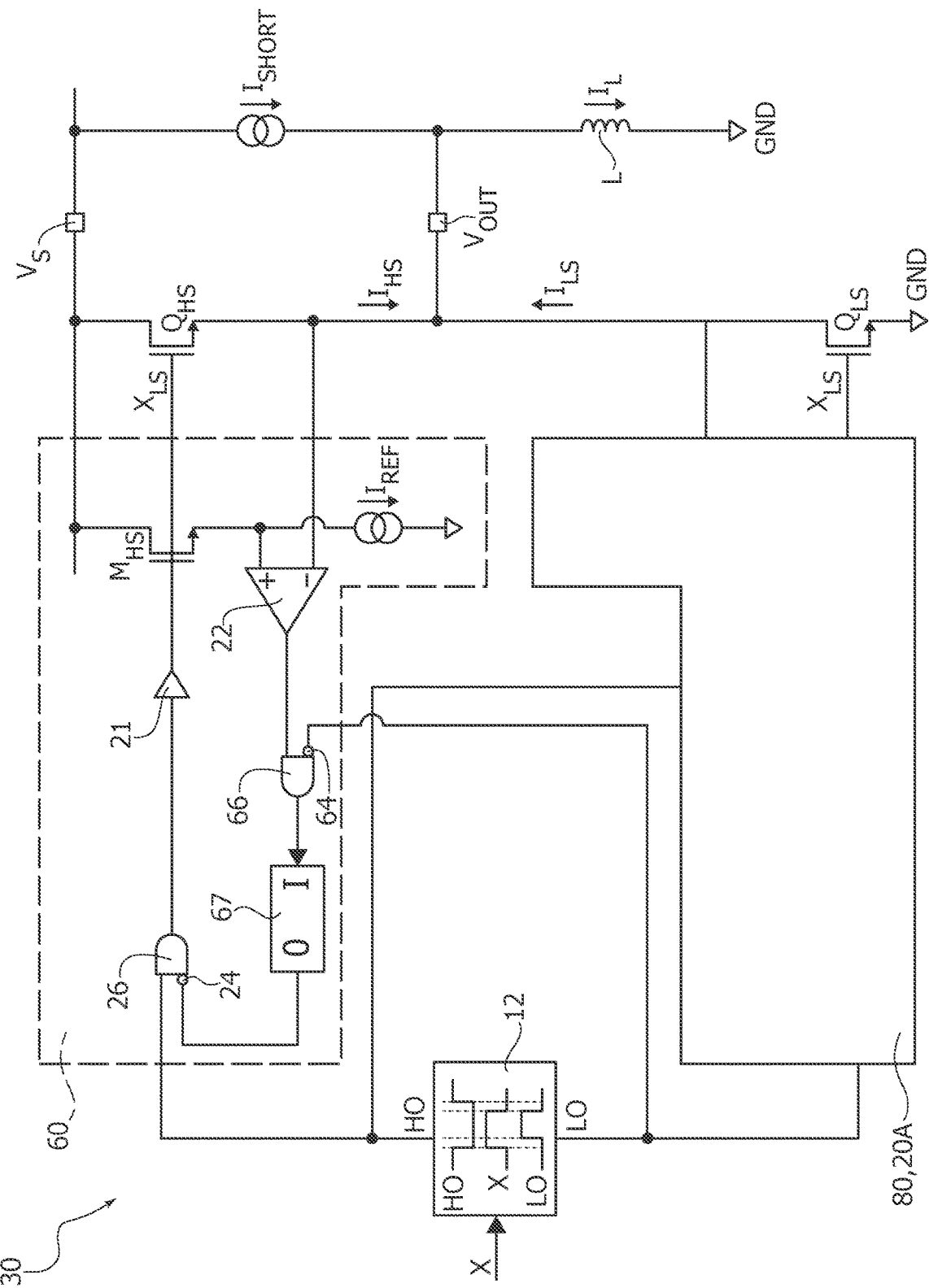
FIGS. 10 and 11 are diagrams exemplary of alternative configurations of switched devices as per the present disclosure.
Figure 11:
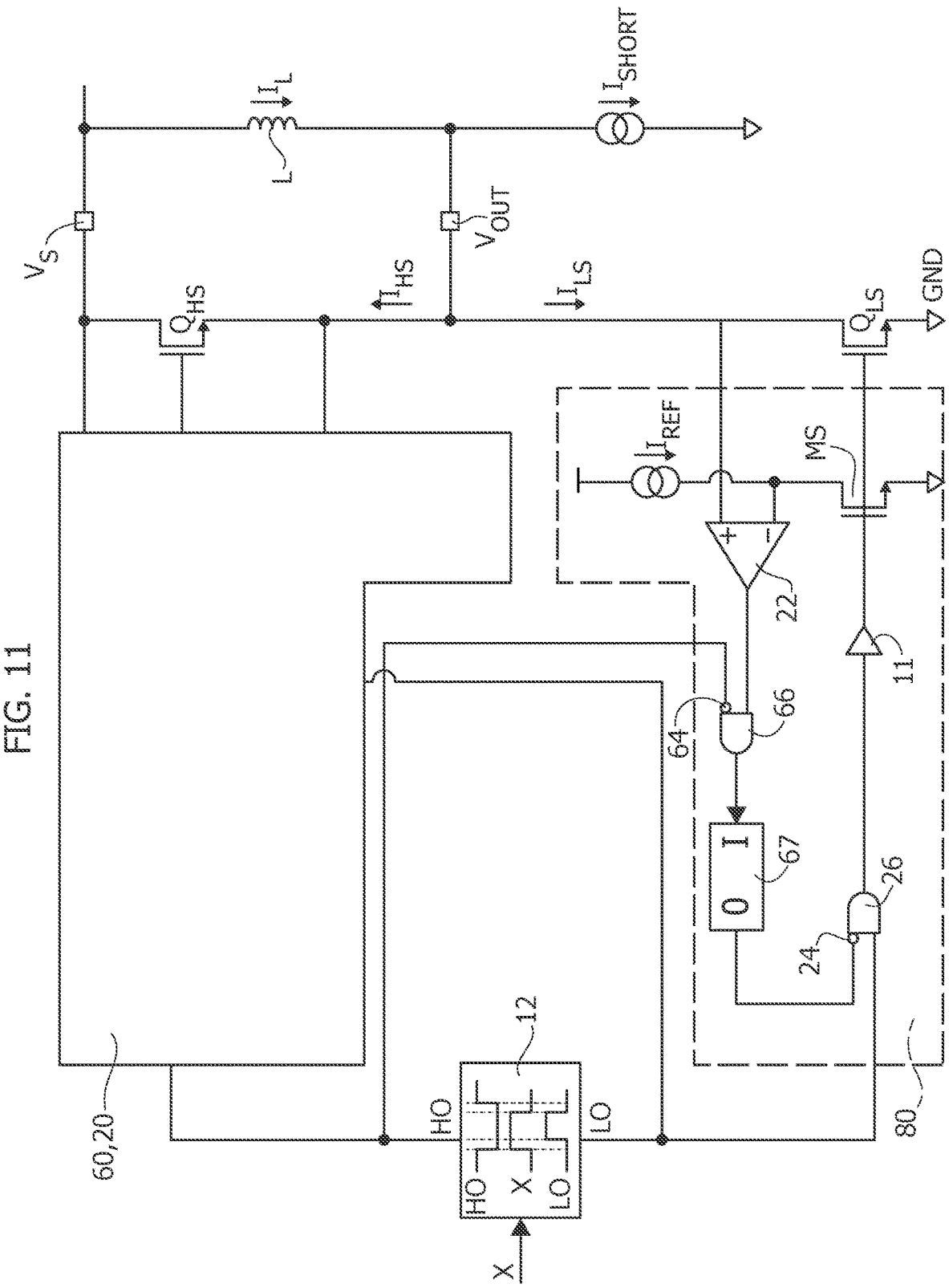

As exemplified in FIGS. 10 and 11, the protection circuit configurations 60 and 80 may be used in a same circuit both in the case in which the freewheeling transistor is the second switching transistor $Q_{LS}$ (as exemplified in FIG. 10) or the first switching transistor $Q_{HS}$ (as exemplified in FIG. 11).

As exemplified in FIG. 10, in case the freewheeling transistor is the second switching transistor $Q_{LS}$, the protection circuit 20A exemplified in FIG. 3 may be used to protect the second switching transistor $Q_{LS}$ while the protection circuit configuration 60 exemplified in FIG. 6 may be used to protect the first switching transistor $Q_{HS}$.

As exemplified in FIG. 11, in case the freewheeling transistor is the first switching transistor $Q_{HS}$, the protection circuit 20 exemplified in FIG. 1 may be used to protect the first switching transistor $Q_{HS}$ while the protection circuit configuration 80 may be used to protect the second switching transistor $Q_{LS}$.

As exemplified herein, a switched converter device 10, 30, 50 comprises: a circuit as exemplified herein; a battery B configured to provide a voltage supply level to said high-side reference node $V_S$; a ground node GND configured to provide a ground voltage level to said low-side reference node; and control circuitry 12 configured to provide the high-side control signal HO and the low-side control signal LO to the high-side control node $X_{HS}$ and to the low-side control node $X_{LS}$.

Figure 12:
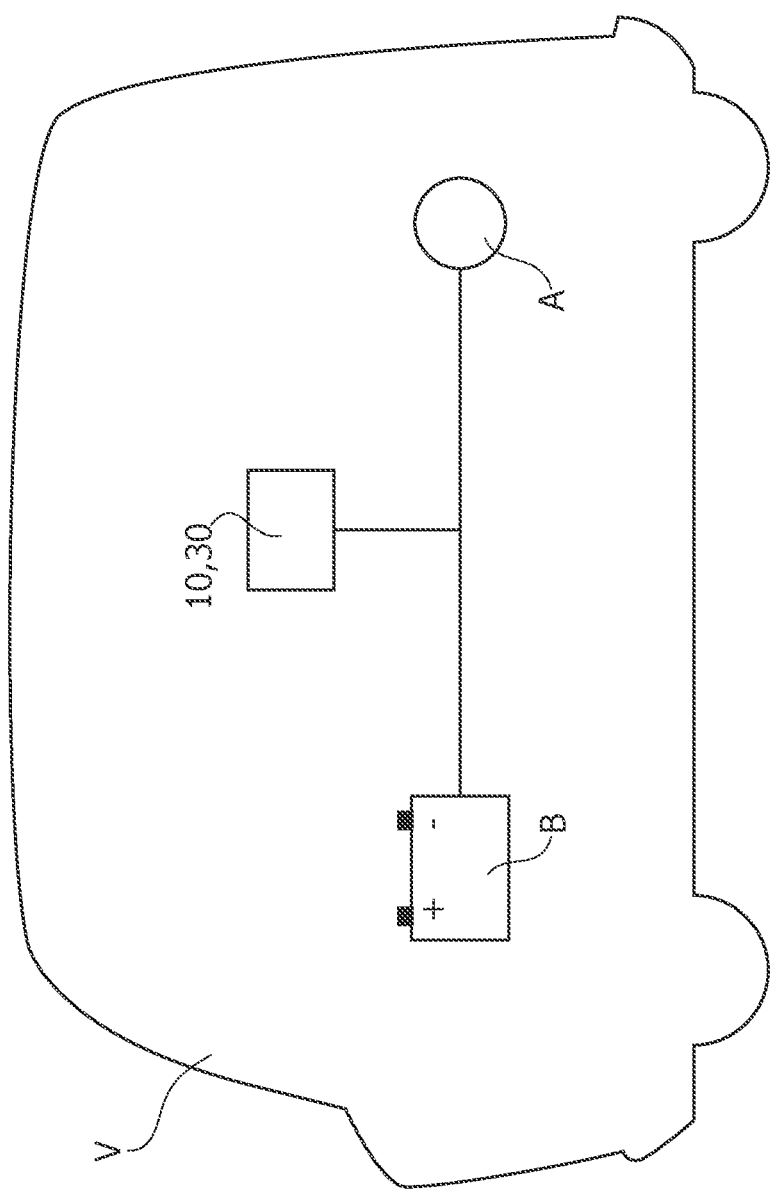
FIG. 12 is a diagram exemplary of a vehicle equipped with a switched device as per the present disclosure.

As exemplified in FIG. 12, any of the protection circuits 20, 20A, 60, 80 may be integrated in power supply units comprising the circuit 10 or 30 equipped on-board a vehicle V. For instance, the vehicle battery B may provide the power supply VS and the switching transistor may be used to power user circuitry A on board the vehicle V.

As exemplified herein, a vehicle V is equipped with the switched converter device as per the present disclosure.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection.

The claims are an integral part of the technical teaching provided herein with reference to the embodiments.

The extent of protection is defined by the annexed claims.

The invention claimed is:

1. A method, comprising:
coupling a high-side switching transistor between a high-side reference node and a switching node, wherein the high-side switching transistor comprises a high-side control terminal configured to receive a high-side control signal and a current flow path therethrough between the high-side reference node and the switching node, wherein the high-side switching transistor is configured to be switched towards a conductive state in response to the high-side control signal having a first value, wherein the current flow path provides a high-side current flow line between the high-side reference node and the switching node;
coupling a low-side switching transistor between the switching node and a low-side reference node, wherein the low-side switching transistor comprises a low-side control terminal configured to receive a low-side control signal and a current flow path therethrough between the switching node and the low-side reference node, wherein the low-side switching transistor is configured to be switched towards a conductive state in response to the low-side control signal having a first value, wherein the current flow path through the low-side switching transistor provides a current flow line between the switching node and the low-side reference node;
coupling an inductive load to the switching node and a reference node, said reference node comprising one of the high-side reference node with the high-side switching transistor being freewheeling and the low-side reference node with the low-side switching transistor being freewheeling; and
in response to a short circuit occurring at the switching node with the respective freewheeling switching transistor in the conductive state:
sensing an electrical signal at the switching node;
performing a comparison between the electrical signal sensed at the switching node and a threshold level; and
providing a driving signal to the control node of the respective freewheeling switching transistor to switch the respective freewheeling switching transistor to the non-conductive state as a result of the comparison indicating that the electrical signal has reached the threshold level.

2. The method of claim 1, comprising:
coupling a sensing transistor to the freewheeling switching transistor, wherein the sensing transistor has an area proportional to the area of the freewheeling switching transistor; and
sensing the electrical signal at the switching node via the sensing transistor.

3. The method of claim 1, wherein providing the driving signal to the control node of the freewheeling switching transistor comprises:
triggering a time counter to start counting time intervals in response to the electrical signal reaching the threshold level;
asserting a comparison signal for as long as the electrical signal reaches the threshold level;
providing the driving signal to the control node of the freewheeling switching transistor in response to the time counter reaching a time count equal to a time interval and the comparison signal remaining asserted during the time interval; and
switching the freewheeling switching transistor towards the non-conductive state as a result.

4. The method of claim 3, further comprising resetting the time counter in response to the time counter failing to reach a time count equal to the time interval.

5. A method for controlling a circuit that includes a high-side switching transistor coupled in series with a low-side switching transistor at a switching node that is coupled to an inductive load in a way that makes one of the high-side switching transistor and low-side switching transistor being a freewheeling switching transistor, the method comprising, in response to a short circuit occurring at the switching node when the freewheeling switching transistor in a conductive state:
sensing an electrical signal at the switching node;
performing a comparison between the sensed electrical signal and a threshold; and
driving the freewheeling switching transistor to a non-conductive state when the comparison indicates that the sensed electrical signal has reached the threshold.

6. The method of claim 5, wherein sensing the electrical signal comprises using a sense transistor having a common control terminal with the freewheeling switching transistor to sense the electrical signal at the switching node.

7. The method of claim 5, wherein driving comprises:
counting time intervals in response to the electrical signal reaching the threshold level;
driving the freewheeling switching transistor to the non-conductive state when a value of the counted time intervals reaches a time count.

8. A circuit, comprising:
a high-side switching transistor coupled between a high-side reference node and a switching node, wherein the high-side switching transistor comprises a high-side control terminal configured to receive a high-side control signal and a current flow path therethrough between the switching node and the high-side reference node, wherein the high-side switching transistor is configured to be switched towards a conductive state in response to the respective control signal having a first value, and wherein the current flow path through the high-side switching transistor provides a high-side current flow line between the switching node and the high-side reference node;
a low-side switching transistor coupled between the switching node and a low-side reference node, wherein the low-side switching transistor comprises a low-side control terminal configured to receive a low-side control signal and a current flow path therethrough between the switching node and the low-side reference node, wherein the low-side switching transistor is configured to be switched towards a conductive state in response to the respective control signal having a first value, and wherein the current flow path through the low-side switching transistor provides a current flow line between the switching node and the low-side reference node;
an inductive load coupled to the switching node and a reference node comprising one of the high-side reference node with the respective high-side switching transistor being freewheeling and the low-side reference node with the low-side switching transistor arranged being freewheeling; and
protection circuitry coupled to the control node of the freewheeling switching transistor and to the switching node, the protection circuitry configured, in response to a short circuit occurring at the switching node while the freewheeling switching transistor is in the conductive state, to:
   sense an electrical signal at the switching node;
   perform a comparison between the electrical signal sensed at the switching node and a threshold level; and
   provide a driving signal to the control node of the respective freewheeling switching transistor to switch the respective freewheeling switching transistor to the non-conductive state as a result of the comparison indicating that the electrical signal has reached the threshold level.

9. The circuit of claim 8, wherein the protection circuitry comprises a sensing transistor coupled to the freewheeling switching transistor, wherein the sensing transistor is configured to sense the electrical signal at the switching node, and wherein the sensing transistor has a transistor area proportional to the area of the freewheeling switching transistor.

10. The circuit of claim 8, wherein the protection circuitry comprises:
   a comparator having a first input node coupled to the switching node to receive the sensed electrical signal and a second node coupled to the threshold level, the comparator configured to perform the comparison between the electrical signal sensed at the switching node and the threshold level and assert a comparison signal as long as the electrical signal reaches the threshold level;
   logical circuitry coupled to the comparator and configured, in response to the electrical signal reaching the threshold level, to assert a trigger signal; and
   a time counter coupled to the logical circuitry to receive the trigger signal therefrom, the time counter configured to start counting in response to the trigger signal being asserted;
   wherein the protection circuitry provides the driving signal to the control node of the switching transistor arranged to be freewheeling in response to the time counter reaching a time count equal to a time interval and to the comparison signal remaining asserted during the time interval, switching the freewheeling switching transistor towards the non-conductive state as a result.

11. The circuit of claim 10, wherein the protection circuitry is configured to reset the time counter in response to the time counter failing to reach a time count equal to a time interval while the comparison signal is asserted.

12. A switched converter device, comprising:
   a circuit according to claim 8;
   a battery configured to provide a voltage supply level to said high-side reference node;
   a ground node configured to provide a ground voltage level to said low-side reference node; and
   control circuitry configured to provide the high-side control signal and the low-side control signal to the high-side control node and to the low-side control node.

13. A vehicle equipped with the switched converter device of claim 12.

14. A circuit, comprising:
   a high-side switching transistor coupled between a high-side reference node and a switching node;
   a low-side switching transistor coupled between the switching node and a low-side reference node;
   wherein said switching node is configured to be coupled to an inductive load in a way that makes one of the high-side switching transistor and low-side switching transistor a freewheeling switching transistor; and
   a protection circuit configured, in response to a short circuit occurring at the switching node while the freewheeling switching transistor is in the conductive state, to:
      sense an electrical signal at the switching node;
      compare the sensed electrical signal to a threshold; and
      control the freewheeling switching transistor to switch to a non-conductive state as a result of the comparison indicating that the electrical signal has reached the threshold.

15. The circuit of claim 14, wherein the protection circuitry comprises a sensing transistor having a common control terminal with the freewheeling switching transistor to sense the electrical signal at the switching node.

16. The circuit of claim 14, wherein the protection circuitry comprises:
   a comparator configured to compare the sensed electrical signal to the threshold and assert a comparison signal as long as the electrical signal reaches the threshold;
   a logic circuit configured to assert a trigger signal in response to the electrical signal reaching the threshold; and
   a time counter configured to start counting in response to the trigger signal being asserted;
   wherein the freewheeling switching transistor is switched to the non-conductive state in response to the time counter reaching a time count equal to a time interval and the assertion of the comparison signal.

17. A switched converter device, comprising:
   a circuit according to claim 14;
   a battery configured to provide a voltage supply level to said high-side reference node;
   a ground node configured to provide a ground voltage level to said low-side reference node; and
   control circuitry configured to generate control signals for the high-side switching transistor and low-side switching transistor.

18. A vehicle equipped with the switched converter device of claim 17.

* * * * *